US 9,379,279 B2

(12) United States Patent
Daigo

(10) Patent No.: US 9,379,279 B2
(45) Date of Patent: Jun. 28, 2016

(54) EPITAXIAL FILM FORMING METHOD, SPUTTERING APPARATUS, MANUFACTURING METHOD OF SEMICONDUCTOR LIGHT-EMITTING ELEMENT, SEMICONDUCTOR LIGHT-EMITTING ELEMENT, AND ILLUMINATION DEVICE

(71) Applicant: CANON ANELVA CORPORATION, Kawasaki-shi (JP)

(72) Inventor: Yoshiaki Daigo, Kawasaki (JP)

(73) Assignee: CANON ANELVA CORPORATION, Kawasaki-shi (JP)

(*) Notice: Subject to any disclaimer, the term of this patent is extended or adjusted under 35 U.S.C. 154(b) by 0 days.

(21) Appl. No.: 14/577,076

(22) Filed: Dec. 19, 2014

(65) Prior Publication Data

US 2015/0102371 A1    Apr. 16, 2015

Related U.S. Application Data

(63) Continuation of application No. PCT/JP2013/003933, filed on Jun. 24, 2013.

(30) Foreign Application Priority Data

Jun. 26, 2012    (JP) ................. 2012-142819

(51) Int. Cl.
*H01L 33/00* (2010.01)
*H01L 33/32* (2010.01)
(Continued)

(52) U.S. Cl.
CPC ........ *H01L 33/0025* (2013.01); *C23C 14/0617* (2013.01); *C23C 14/345* (2013.01);
(Continued)

(58) Field of Classification Search
CPC . H01L 33/0025; H01L 33/12; H01L 33/0066; H01L 33/0075; H01L 21/02433; H01L 21/02458; H01L 21/02381; H01L 21/02472; H01L 21/0242; H01L 21/02483; H01L 21/02631; H01L 21/0254; C30B 23/08
See application file for complete search history.

(56) References Cited

U.S. PATENT DOCUMENTS

| 5,116,482 A | 5/1992 | Setoyama et al. |
| 6,214,162 B1 * | 4/2001 | Koshimizu ............ H01J 37/321 118/723 I |

(Continued)

FOREIGN PATENT DOCUMENTS

| JP | 60-29956 A | 2/1985 |
| JP | 3-107456 A | 5/1991 |

(Continued)

OTHER PUBLICATIONS

International Search Report issued in PCT/JP2013/003933, dated Sep. 10, 2013 (4 pages).

(Continued)

*Primary Examiner* — John P Dulka
(74) *Attorney, Agent, or Firm* — Fitzpatrick, Cella, Harper & Scinto

(57) ABSTRACT

The present invention has an object to provide an epitaxial film forming method of epitaxially growing a high-quality group III nitride semiconductor thin film on an $\alpha$-$Al_2O_3$ substrate by a sputtering method. An epitaxial film forming method according to an embodiment of the present invention includes forming an epitaxial film of a group III nitride semiconductor thin film on an $\alpha$-$Al_2O_3$ substrate placed on a substrate holder (111) including a heater electrode (104) and a bias electrode (103) in a sputtering apparatus (1) by applying high-frequency power to a target electrode (102) and applying high-frequency bias power to the bias electrode (103) while the heater electrode (104) maintains the $\alpha$-$Al_2O_3$ substrate at a predetermined temperature. In this process, the high-frequency power and the high-frequency bias power are applied so that frequency interference therebetween may not occur.

16 Claims, 5 Drawing Sheets

(51) Int. Cl.
- C23C 14/06 (2006.01)
- C30B 23/02 (2006.01)
- C30B 25/06 (2006.01)
- C30B 29/40 (2006.01)
- H01L 21/02 (2006.01)
- C23C 14/34 (2006.01)
- C23C 14/35 (2006.01)
- C30B 23/08 (2006.01)
- H01L 33/12 (2010.01)

(52) U.S. Cl.
CPC .............. *C23C 14/35* (2013.01); *C30B 23/02* (2013.01); *C30B 23/08* (2013.01); *C30B 25/06* (2013.01); *C30B 29/403* (2013.01); *H01L 21/0242* (2013.01); *H01L 21/0254* (2013.01); *H01L 21/02381* (2013.01); *H01L 21/02433* (2013.01); *H01L 21/02458* (2013.01); *H01L 21/02472* (2013.01); *H01L 21/02483* (2013.01); *H01L 21/02631* (2013.01); *H01L 33/007* (2013.01); *H01L 33/0066* (2013.01); *H01L 33/0075* (2013.01); *H01L 33/12* (2013.01); *H01L 33/32* (2013.01)

(56) References Cited

U.S. PATENT DOCUMENTS

| | | |
|---|---|---|
| 6,590,336 B1 | 7/2003 | Kadota |
| 8,568,571 B2 | 10/2013 | Kwak et al. |
| 8,772,060 B2 | 7/2014 | Sakai et al. |
| 8,882,971 B2 | 11/2014 | Miki et al. |
| 9,136,569 B2 | 9/2015 | Song et al. |
| 2001/0027167 A1 | 10/2001 | Kawakubo et al. |
| 2007/0227877 A1 | 10/2007 | Wang |
| 2009/0315046 A1* | 12/2009 | Miki ............ C23C 14/0036 257/94 |
| 2010/0213476 A1 | 8/2010 | Yokoyama et al. |
| 2011/0064880 A1* | 3/2011 | Yamamoto ............ C23C 14/50 427/294 |
| 2011/0203916 A1 | 8/2011 | Wang |
| 2012/0171784 A1 | 7/2012 | Wang |
| 2013/0049064 A1 | 2/2013 | Daigo et al. |
| 2013/0277206 A1 | 10/2013 | Daigo et al. |
| 2014/0225154 A1 | 8/2014 | Daigo |
| 2016/0002771 A1 | 1/2016 | Song et al. |

FOREIGN PATENT DOCUMENTS

| | | |
|---|---|---|
| JP | 7-14769 A | 1/1995 |
| JP | 7-18431 A | 1/1995 |
| JP | 10-56192 A | 2/1998 |
| JP | 2001-144328 A | 5/2001 |
| JP | 2001-270795 A | 10/2001 |
| JP | 2007-262473 A | 10/2007 |
| JP | 2008-47763 A | 2/2008 |
| JP | 2008-109084 A | 5/2008 |
| JP | 2011-144422 A | 7/2011 |
| JP | 2013-165242 A | 8/2013 |
| KR | 10-2011-0020856 A | 3/2011 |
| KR | 10-2011-0045056 A | 5/2011 |
| WO | 2009/096270 A1 | 6/2009 |
| WO | 2009/154002 A1 | 12/2009 |
| WO | 2011/136016 A1 | 11/2011 |
| WO | 2012/090422 A1 | 7/2012 |

OTHER PUBLICATIONS

Office Action in corresponding Taiwanese Application No. 102122696 dated Apr. 23, 2015 (17 pages including English translation).

Y. Daigo, et al., "Synthesis of epitaxial GaN single-crystalline film by ultra high vacuum r.f. magnetron sputtering method", Thin Solid Films, vol. 483, pp. 38-43 (2005).

Official Letter issued in Korean Application No. 10-2015-7001220 dated Jan. 3, 2016 (7 pages).

* cited by examiner

EPITAXIAL FILM FORMING METHOD, SPUTTERING APPARATUS, MANUFACTURING METHOD OF SEMICONDUCTOR LIGHT-EMITTING ELEMENT, SEMICONDUCTOR LIGHT-EMITTING ELEMENT, AND ILLUMINATION DEVICE

CROSS-REFERENCES TO RELATED APPLICATIONS

This application is a continuation application of International Application No. PCT/JP2013/003933, filed Jun. 24, 2013, which claims the benefit of Japanese Patent Application No. 2012-142819 filed Jun. 26, 2012. The contents of the aforementioned applications are incorporated herein by reference in their entireties.

TECHNICAL FIELD

The present invention relates to an epitaxial film forming method, a sputtering apparatus, a manufacturing method of a semiconductor light-emitting element, a semiconductor light-emitting element, and an illumination device and particularly to an epitaxial film forming method capable of forming a high-quality epitaxial film, a manufacturing method of a semiconductor light-emitting element using such epitaxial film, a sputtering apparatus, a semiconductor light-emitting element, and an illumination device.

BACKGROUND ART

Group III nitride semiconductors are compound semiconductor materials of an aluminum (Al) atom, a gallium (Ga) atom, and an indium (In) atom which are group IIIB elements (hereinafter referred to simply as III elements) and a nitrogen (N) atom which is a group VB element (hereinafter referred to simply as a group V element). That is, compound semiconductor materials obtained as aluminum nitride (AlN), gallium nitride (GaN), indium nitride (InN) and their mixed crystals (AlGaN, InGaN, InAlN, InGaAlN) are group III nitride semiconductors.

Elements using the group III nitride semiconductors include optical devices such as light-emitting diodes covering a wide wavelength region over far-ultraviolet/visible/near-infrared regions (LED: Light Emitting Diode), laser diode (LD), solar cell (PVSC: Photovoltaic Solar Cell), photodiode (PD) and the like and electronic devices such as high electron mobility transistor for high-frequency/high-output applications (HEMT: High Electron Mobility Transistor), metal-oxide-semiconductor field effect transistor (MOSFET) and the like.

In order to realize element applications as above, it is necessary to epitaxially grow a group III nitride semiconductor thin film on a single crystal substrate so as to obtain a high-quality single crystal film with few crystal defects (epitaxial film). However, since a single crystal substrate made of a group III nitride semiconductor is extremely expensive, it is not used except some applications, and a single crystal film is obtained mainly by hetero-epitaxial growth of sapphire ($\alpha$-$Al_2O_3$), silicon carbide (SiC) on dissimilar substrates.

For the epitaxial growth of such group III nitride semiconductor thin film, a metal organic chemical vapor deposition (MOCVD) method by which high-productivity and high-quality epitaxial films can be obtained is used. However, the MOCVD method has problems that a production cost is high, particles can be easily generated and it is difficult to obtain high yield and the like.

On the other hand, a sputtering method has features that a production cost can be suppressed low and particle generation probability is also low. Therefore, if at least a part of a film forming process of the group III nitride semiconductor thin film can be replaced by the sputtering method, it is likely that at least a part of the above-described problems can be solved.

However, the group III nitride semiconductor thin film fabricated by using the sputtering method has a problem that a crystal quality tends to become poorer than those fabricated by using the MOCVD method. For example, crystalline of the group III nitride semiconductor thin film fabricated by using the sputtering method is disclosed in NPL 1, for example. In NPL 1, a GaN film with c-axis orientation is epitaxially grown on an $\alpha$-$Al_2O_3$ (0001) substrate by using a high-frequency magnetron sputtering method. NPL 1 describes that in X-ray rocking curve (XRC) measurement of a GaN (0002) plane, its full width at half maximum (FWHM) is 35.1 arcmin (2106 arcsec). This value is an extremely large value as compared with a GaN film on the $\alpha$-$Al_2O_3$ substrate currently sold in the market and indicates that mosaic expansion of tilt which will be described later is large and crystal quality is poor.

Here, concepts used as indexes indicating the crystal quality, that is, (1) mosaic expansion of tilt, (2) mosaic expansion of twist, and (3) polarity will be described in brief. The mosaic expansion of tilt in (1) indicates a degree of variation in crystal orientation in a substrate perpendicular direction, and the mosaic expansion of twist in (2) indicates a degree of variation in crystal orientation in a substrate in-plane direction. The polarity in (3) is a term meaning an orientation of a crystal, and in the case of c-axis orientation film, there are two types of growth modes, that is, +c polarity and −c polarity. The growth with the +c polarity corresponds to (0001) orientation and the growth with −c polarity corresponds to (000-1) orientation.

It is necessary for a single crystal with favorable crystalline that mosaic expansion of tilt and twist is small and also, and that polarity is uniformly either of +c polarity or −c polarity. Since a group III nitride semiconductor thin film with favorable morphology and excellent crystalline can be easily obtained with the +c polarity, in particular, establishment of a process of obtaining group III nitride semiconductors with the +c polarity is in demand. On the other hand, many attempts have been made in order to obtain a good-quality group III nitride semiconductor thin film by the sputtering method (See PTLs 1 and 2).

PTL 1 discloses a method of realizing higher quality of group III nitride semiconductor thin films by applying plasma processing to a substrate before a group III nitride semiconductor thin film (AlN in PTL 1) is formed on an $\alpha$-$Al_2O_3$ substrate by using the sputtering method or particularly a method of obtaining a group III nitride semiconductor thin film with extremely small mosaic expansion of tilt.

Moreover, PTL 2 discloses a manufacturing method of a group III nitride semiconductor (group III nitride compound semiconductor in PTL 2) light-emitting element in which a buffer layer (an intermediate layer in PTL 2) made of the group III nitride semiconductor (group III nitride compound in PTL 2) is formed on a substrate by the sputtering method and an n-type semiconductor layer provided with a base film, a light-emitting layer, and a p-type semiconductor layer are sequentially laminated on the buffer layer made of this group III nitride semiconductor.

PTL 2 describes that, as a procedure for forming the buffer layer made of the group III nitride semiconductor, a pre-treatment process of applying plasma processing to a substrate and a process of depositing the buffer layer made of the group III nitride semiconductor by sputtering method subsequently to the pre-treatment process. Moreover, in PTL 2, as a preferable mode of the substrate and the buffer layer made of the group III nitride semiconductor, an $\alpha$-$Al_2O_3$ substrate and AlN are used, and as a deposition method of the n-type semiconductor layer provided with a base film, the light-emitting layer, and the p-type semiconductor layer, the MOCVD method is preferably used.

CITATION LIST

Patent Literature

PTL 1: International Publication No. 2009/096270
PTL 2: Japanese Patent Application Laid-Open No. 2008-109084

Non Patent Literature

NPL 1: Y. Daigo, N. Mutsukura, "Synthesis of epitaxial GaN single-crystalline film by ultra high vacuum r.f. magnetron sputtering method", Thin Solid Films 483 (2005) p 38-43.

SUMMARY OF INVENTION

According to the already disclosed prior-art technologies (PTL 1 and PTL 2), a group III nitride semiconductor having small mosaic expansion of tilt or twist is obtained by the sputtering method. However, the prior-art technologies do not disclose a method of controlling polarity, and there is a serious problem in employing the sputtering method as a manufacturing process of a group III nitride semiconductor.

Actually, when an AlN film was formed on an $\alpha$-$Al_2O_3$ substrate by the sputtering method by using the technologies disclosed in PTLs 1 and 2, an AlN film with small mosaic expansion of tilt or twist could be obtained but the +c polarity and the –c polarity were mixed with regard to the polarity. Moreover, when a GaN film was grown on the AlN film in which the +c polarity and the –c polarity were mixed by the MOCVD method, a high-quality GaN film could not be obtained. Moreover, a light-emitting element was fabricated by using the obtained GaN film, but favorable emission characteristics could not be obtained. Therefore, mixture of the +c polarity and the –c polarity is not reduced and a group III nitride semiconductor thin film with the +c polarity cannot be obtained only by the technologies disclosed in PTLs 1 and 2. That is, though the technologies disclosed in PTLs 1 and 2 are effective technologies since the mosaic expansion of tilt or twist can be made small, unification of polarity as much as possible is in demand in order to obtain a group III nitride semiconductor thin film with a higher quality.

The present invention is made in view of the above-described problems and has an object to provide an epitaxial film forming method capable of fabricating an epitaxial film with improved degree of unification of the +c polarity (improved (0001) orientation) and further to provide a manufacturing method of a semiconductor light-emitting element using this epitaxial film, a sputtering apparatus, a semiconductor light-emitting element manufactured by this manufacturing method, and an illumination device.

The inventors have obtained a new finding as the result of keen examination that polarity of an epitaxial film can be controlled by high-frequency bias electric power applied to a bias electrode built in a substrate holder as will be described later and completed the present invention.

In order to achieve the above-described object, an epitaxial film forming method according to an aspect of the present invention is an epitaxial film forming method of forming an epitaxial film on a substrate by using a sputtering method, the method including: placing the substrate in a vacuum vessel in which at least one of a target with a wurtzite structure and a target for forming a film with a wurtzite structure by film formation; applying high-frequency power to a target electrode to which the target is attached, and applying high-frequency bias power to a substrate holder supporting the substrate in such a manner as to suppress frequency interference therebetween; and forming the epitaxial film on the substrate by sputtering the target with plasma generated by the high-frequency power. A manufacturing method of a semiconductor light-emitting element according to another aspect of the present invention includes the step of forming a buffer layer of the semiconductor light-emitting element by the aforementioned epitaxial film forming method. Moreover, a semiconductor light-emitting element according to another aspect of the present invention is a semiconductor light-emitting element in which at least a buffer layer, a group III nitride semiconductor intermediate layer, an n-type group III nitride semiconductor layer, a group III nitride semiconductor active layer, a p-type group III nitride semiconductor layer, and a translucent electrode are formed on the substrate. At least one layer of the buffer layer, the group III nitride semiconductor intermediate layer, the n-type group III nitride semiconductor layer, the group III nitride semiconductor active layer, and the p-type group III nitride semiconductor layer is fabricated by the aforementioned epitaxial film forming method. A illumination device according to another aspect of the present invention includes the aforementioned semiconductor light-emitting element.

Further, a sputtering apparatus according to another aspect of the present invention is a sputtering apparatus for executing the aforementioned epitaxial film forming method, and includes: a power supply; a target electrode on which a target is able to be placed a substrate holder on which a substrate is able to be placed to face the target electrode, and which includes a heater electrode and a bias electrode; and frequency interference suppressing means for suppressing frequency interference between the high-frequency power applied to the target electrode and the high-frequency bias power applied to the bias electrode when forming the firm with the wurtzite structure by the aforementioned epitaxial film forming method.

According to the present invention, an epitaxial film of a semiconductor with a wurtzite structure, including a group III nitride semiconductor, in which mosaic expansion of tilt or twist is small, mixture of +c polarity and –c polarity is reduced, and unification of the +c polarity is improved can be fabricated on a substrate by using the sputtering method. Moreover, by using the semiconductor epitaxial film with the wurtzite structure fabricated by this sputtering method, light emission characteristics of light-emitting elements such as LED and LD can be improved.

DESCRIPTION OF EMBODIMENTS

Figure 1:
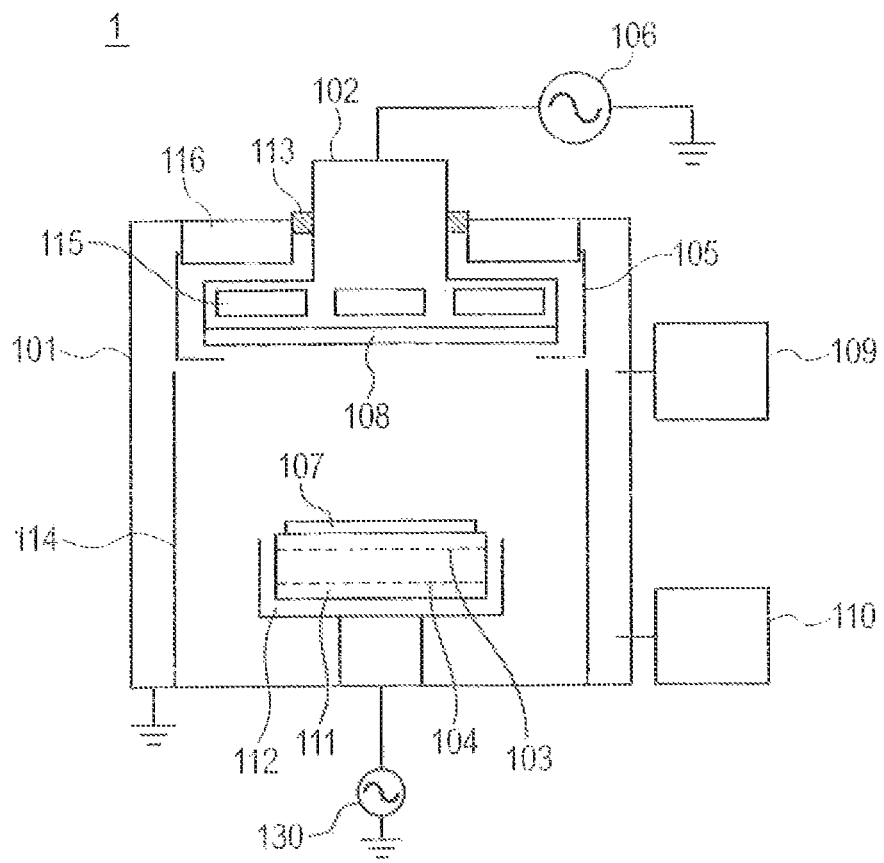
FIG. 1 is a sectional schematic diagram of a high-frequency sputtering apparatus according to one embodiment of the present invention.

Embodiments of the present invention will be described below in detail. In the figures which will be described below, the same reference numerals are given to those having the same functions and duplicated explanation will be omitted.

A major feature of the present invention is that, when a group III nitride semiconductor thin film is to be epitaxially grown on an $\alpha$-$Al_2O_3$ substrate by using a sputtering method such as a high-frequency sputtering method, for example, the $\alpha$-$Al_2O_3$ substrate is heated to an arbitrary temperature by a substrate holder provided with a heater electrode and a bias electrode and then, a film of the group III nitride semiconductor is formed while a high-frequency bias power is applied to the bias electrode. The present invention will be described by referring to the attached drawings. Members, arrangements and the like which will be described below are one example which embodies the invention and do not limit the present invention and they can be naturally modified in various ways in accordance with the gist of the present invention.

FIG. 1 is a schematic configuration diagram illustrating an example of a sputtering apparatus used in forming a group III nitride semiconductor thin film according to an embodiment of the present invention. In FIG. 1 illustrating a sputtering apparatus 1, reference numeral 101 denotes a vacuum vessel, reference numeral 102 denotes a target electrode, reference numeral 103 denotes a bias electrode, reference numeral 104 denotes a heater electrode, reference numeral 105 denotes a target shield, reference numeral 106 denotes a high-frequency power supply for sputtering, reference numeral 107 denotes a substrate, reference numeral 108 denotes a target, reference numeral 109 denotes a gas introduction mechanism, reference numeral 110 denotes an evacuation mechanism, reference numeral 111 denotes a substrate holder, reference numeral 112 denotes a reflector, reference numeral 113 denotes an insulating material, reference numeral 114 denotes a chamber shield, reference numeral 115 denotes a magnet unit, reference numeral 116 denotes a target-shield holding mechanism, and reference numeral 130 denotes a high-frequency power supply for bias, respectively. Reference numeral 111 in FIG. 1 is assumed to be arbitrary one of substrate holders 111a, 111b, and 111c which will be described later. Moreover, as the substrate 107, an $\alpha$-$Al_2O_3$ substrate (601) to be described later can be used.

The vacuum vessel 101 is formed of metal member such as stainless and aluminum alloy and is electrically grounded. Moreover, the vacuum vessel 101 is provided with a cooling mechanism, not shown, and the cooling mechanism prevents or reduces temperature rise of a wall surface. Moreover, the vacuum vessel 101 is connected to the gas introduction mechanism 105 through a mass flow controller, not shown, and is connected to the evacuation mechanism 110 through a variable conductance valve, not shown.

The target shield 105 is mounted on the vacuum vessel 101 through the target-shield holding mechanism 116. The target-shield holding mechanism 116 and the target shield 105 can be made of a metal member such as stainless and aluminum alloy and is electrically connected to the vacuum vessel 101.

The target electrode 102 is mounted on the vacuum vessel 101 through the insulating material 113. Moreover, the target 108 is mounted on the target electrode 102, and the target electrode 102 is connected to the high-frequency power supply 106 for sputtering through a matching box, not shown. The target 108 may be directly mounted on the target electrode 102 or may be mounted on the target electrode 102 through a bonding plate, not shown, made of a metal member such as copper (Cu). Moreover, the target 108 may be a metal target containing at least one of Al, Ga, or In or a nitride target containing at least one of the above-described group III elements. On the target electrode 102, a cooling mechanism, not shown, for preventing temperature rise of the target 108 is provided. Moreover, the target electrode 102 incorporates the magnet unit 115. As power to be input to the target electrode 102 from the high-frequency power supply 106 for sputtering, industrially 13.56 MHz can be used easily, but it is also possible to use high frequency of another frequency, to superimpose a direct current on a high frequency or to use them in pulse.

The chamber shield 114 is mounted on the vacuum vessel 101 and prevents or reduces adhesion of a film to the vacuum vessel 101 during film formation. The substrate holder 111 has the heater electrode 104 and the bias electrode 103 therein. To the heater electrode 104, a power supply for heating, not shown, is connected, while to the bias electrode 103, a high-frequency power supply 130 for bias is connected through a matching box, not shown.

Figure 2:
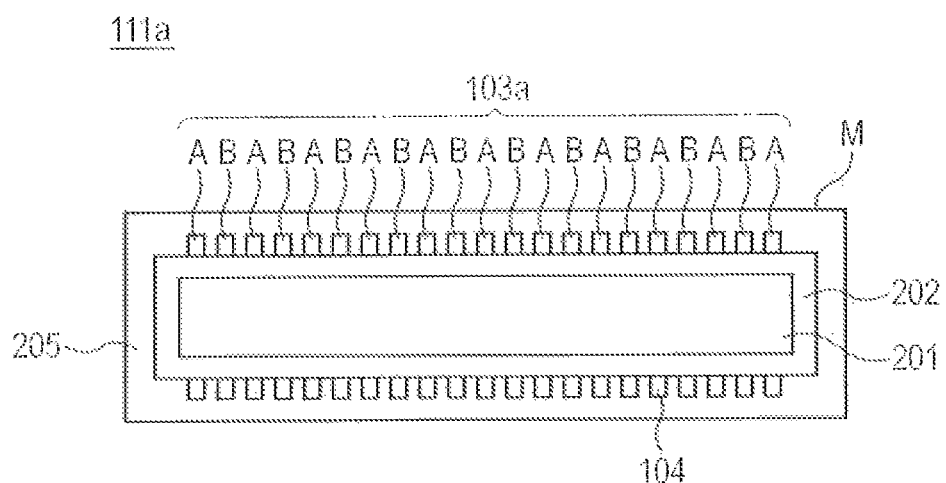
FIG. 2 is a diagram illustrating a first configuration example of a substrate holder according to one embodiment of the present invention.
Figure 3:
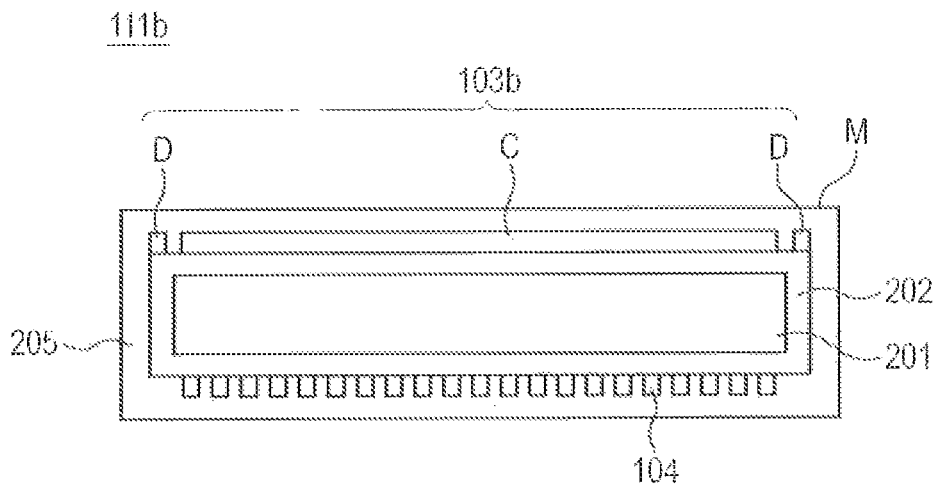
FIG. 3 is a diagram illustrating a second configuration example of a substrate holder according to one embodiment of the present invention.
Figure 4:
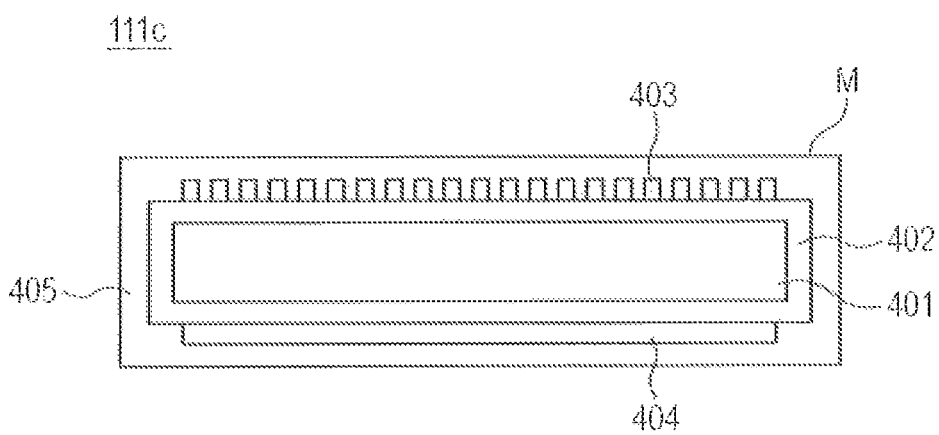
FIG. 4 is a diagram illustrating a third configuration example of a substrate holder according to one embodiment of the present invention.

FIGS. 2 to 4 illustrate the configuration examples 111a, 111b, and 111c of the substrate holder 111, respectively, and reference numeral M in each figure denotes a substrate placement surface. In FIG. 2 (or FIG. 3), reference numeral 201 denotes a base, reference numeral 202 denotes a base coat, reference numeral 103a (or reference numeral 103b) denotes a bias electrode, reference numeral 104 denotes the heater electrode, and reference numeral 205 denotes an over coat. The base 201 is made of graphite, the base coat 202 and the over coat 205 are made of pyrolytic boron nitride (PEN), and the bias electrode 103a (or 103b) and the heater electrode 104 are made of pyrolytic graphite (PG), and the base coat 202 and the over coat 205 made of PBN are dielectric materials with high resistance.

In FIG. 2 (or FIG. 3), a power supply for heating, not shown, is connected to the heater electrode 104. Joule heat is generated by having an AC or DC current flow through the heater electrode 104, and the $\alpha$-$Al_2O_3$ substrate placed on the substrate holder 111a (or 111b) can be heated by infrared rays from the substrate holder heated by the Joule heat.

Moreover, in FIG. 2 (or FIG. 3), the high-frequency power supply 130 for bias is connected to the bias electrode 103a (or 103b) through a matching box, not shown. By applying high-frequency bias power to the bias electrode 103a (or 103b) during film formation, a negative DC bias voltage can be generated on the surface of the α-Al$_2$O$_3$ substrate placed on the substrate holder 111a (or 111b).

It is also possible to further connect a power supply for an electrostatic chuck (ESC), not shown, to the bias electrode 103a (or 103b) in FIG. 2 (or FIG. 3) through a low-pass filter, not shown. In such a case, the bias electrode 103a is configured as electrically separated electrodes as indicated by reference numeral A and reference numeral B (one is a first electrode, while the other is a second electrode), and a bipolar ESC may be realized by applying positive and negative DC voltages to the electrodes, respectively. In this way, since the α-Al$_2$O$_3$ substrate can be electrostatically adsorbed to the substrate holder, the α-Al$_2$O$_3$ substrate placed on the substrate holder 111a can be efficiently heated. With regard to the substrate holder 111b, too, the bias electrode 103b is configured as electrically separated electrodes as indicated by reference numeral C and reference numeral D (one is a first electrode, while the other is a second electrode) and a bipolar ESC can be realized by applying positive and negative DC voltages to the electrodes, respectively.

FIG. 4 is another configuration example 111c of the substrate holder 111. Reference numeral 401 denotes a base, reference numeral 402 denotes a base coat, reference numeral 403 denotes a common electrode, reference numeral 404 denotes a backside coat, and reference numeral 405 denotes an over coat. The base 401 is made of graphite, the base coat 402 and the over coat 405 are made of PBN, the common electrode 403 and the backside coat 404 are made of PG, and the base coat 402 and the over coat 405 made of PBN are dielectric materials with high resistance.

In FIG. 4, to the common electrode 403, the high-frequency power supply 130 for bias is connected through a matching box, and moreover, a power supply for heating, not shown, is connected through a low-pass filter, not shown.

In FIG. 4, the common electrode 403 functions collectively as the heater electrode 104 and the bias electrode 103a in FIG. 2. By having an AC or DC current flow from the power supply for heating to the common electrode 403, the substrate holder 111c produces heat, and the α-Al$_2$O$_3$ substrate placed on the substrate holder 111c is heated by the infrared rays thereof. Moreover, by further applying high-frequency bias power from the high-frequency power supply for bias in a state where the current for heating is made to flow through the common electrode 403, a negative DC bias voltage can be generated on the surface of the α-Al$_2$O$_3$ substrate, while the α-Al$_2$O$_3$ substrate placed on the substrate holder 111c is heated. In this way, the effect of the present invention can be also obtained by using the common electrode in which the heater electrode and the bias electrode are integrated.

In the substrate holder 111a having a structure illustrated in FIG. 2, Joule heat generated from the heater electrode 104 is transmitted to the substrate placement surface M side through the base coat 202, the base 201, the over coat 205, and the bias electrode 103a. At this time, particularly since the base 201 plays a role as a soaking plate, high soaking performance can be easily obtained in the substrate plane.

Moreover, in the substrate holder 111b having a structure illustrated in FIG. 3, the bias electrode 103b is formed of a substantially disk-shaped electrode (corresponding to reference numeral C) at the center part and a substantially ring-shaped electrode (corresponding to reference numeral D) on an outer periphery part. Thus, the bias electrode 103b (particularly the reference numeral C part) further plays a role of a soaking plate and can further improve the soaking performance in the plane more than the substrate holder 111a having the structure illustrated in FIG. 2. Particularly, if the α-Al$_2$O$_3$ substrate is adsorbed by the ESC, temperature distribution depending on a pattern shape of the bias electrode 103a might be generated in the substrate holder 111a having the structure illustrated in FIG. 2, but with the structure as in FIG. 3, such problem can be markedly improved.

By using the ESC, a temperature rising speed after the α-Al$_2$O$_3$ substrate is placed on the substrate holders 111a and 111b can be increased and thus, use of the ESC is a preferable mode in obtaining high productivity.

In the substrate holder 111c having a structure illustrated in FIG. 4, Joule heat generated from the common electrode 403 is transmitted to the substrate placement surface M side not through the base 401 or the base coat 402. Thus, as compared with the substrate holders illustrated in FIGS. 2 and 3, it is difficult to obtain high soaking performance. On the other hand, since the α-Al$_2$O$_3$ substrate is heated not though the base 401 or the base coat 402, temperature gradient of the substrate placement surface M and the common electrode 403 becomes small, and the substrate can be heated with high power use efficiency without using the ESC.

The material constituting the substrate holder illustrated in FIGS. 2 to 4 is preferably used since efficiency to heat the α-Al$_2$O$_3$ substrate is higher than a prior-art infrared lamp, but this is not limiting as long as the α-Al$_2$O$_3$ substrate can be heated to a predetermined temperature.

Moreover, the substrate holder is not limited to the structures of the above-described substrate holders 111a, 111b, and 111c. The structures of the above-described substrate holders 111a, 111b, and 111c are preferable modes since they can improve soaking performance and power use efficiency, and thus the structure can be selected as appropriate in accordance with the purpose. However, in the present invention, it is important that a negative DC bias voltage is generated on the surface of the α-Al$_2$O$_3$ substrate by applying high-frequency bias power to the bias electrode at a predetermined temperature, and as a result, an epitaxial film of the group III nitride semiconductor with a wurtzite structure can be formed with +c polarity. Therefore, it is needless to say that any structure can be applied to this embodiment as long as the structure accords with the gist of the present invention. Moreover, it is preferable that the bias electrodes 103a and 103b and the common electrode 400a be coated with highly-resistant dielectric materials. In some cases, an epitaxial film with +c polarity can be formed even if the bias electrodes 103a and 103b and the common electrode 400a are not coated with highly-resistant dielectric materials. However, charged particles in a plasma space may reach the aforementioned electrodes and make the negative DC bias voltages varied. Such a variation in the negative DC bias voltages is undesirable for stable formation of an epitaxial film with +c polarity.

Figure 5:
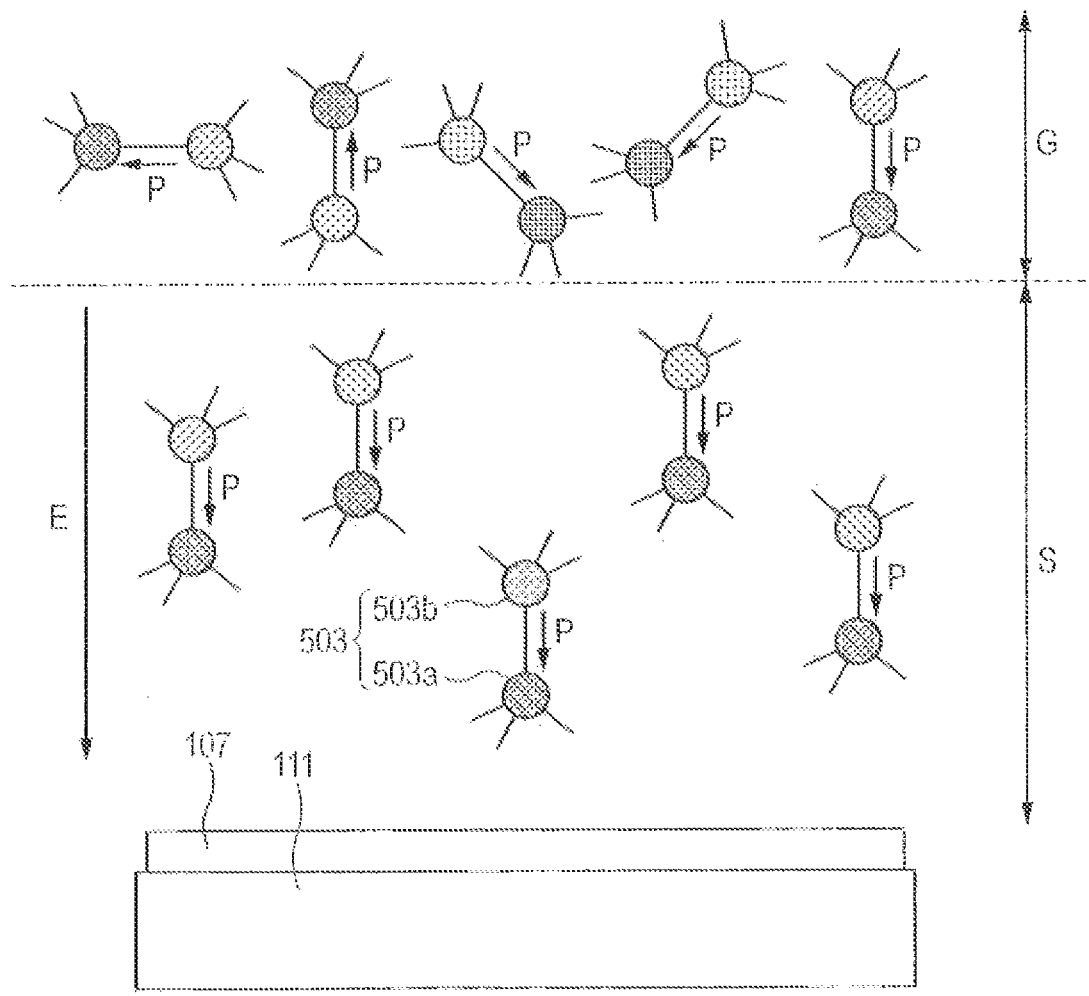
FIG. 5 is a diagram illustrating a model in which a group III nitride semi conductor thin film with +c polarity is formed according to one embodiment of the present invention.

FIG. 5 is a model diagram illustrating a mechanism in which the group III nitride semiconductor thin film is formed with +c polarity by applying high-frequency bias power to the bias electrode. In FIG. 5, reference numeral 111 denotes any one of the substrate holders 111a, 111b, and 111c, and reference numeral 107 is an α-Al$_2$O$_3$ substrate, and reference numeral 503 is a nitride molecule.

Figure 6:
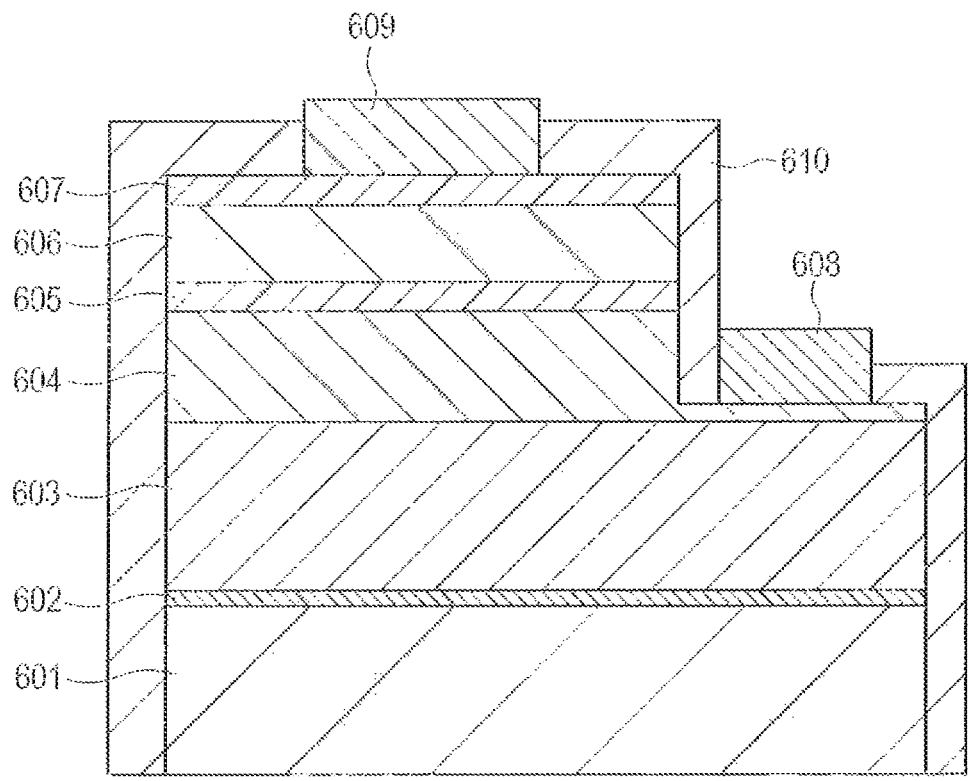
FIG. 6 is a sectional view illustrating an example of an LED structure fabricated by using an epitaxial film formed by an epitaxial film forming method according to one embodiment of the present invention.

FIG. 6 is an example of a sectional structure of a light-emitting diode (LED) as a semiconductor light-emitting element fabricated by using the manufacturing method of the group III nitride semiconductor thin film according to the embodiment of the present invention. In FIG. 6, reference numeral 601 denotes an α-Al$_2$O$_3$ substrate, reference numeral 602 denotes a buffer layer, reference numeral 603 denotes a group III nitride semiconductor intermediate layer, reference numeral 604 denotes an n-type group III nitride semiconductor layer, reference numeral 605 denotes a group III nitride semiconductor active layer, reference numeral 606 denotes a p-type group III nitride semiconductor layer, reference numeral 607 denotes a translucent electrode, reference numeral 608 denotes an n-type electrode, reference numeral 609 denotes a p-type bonding pad electrode, and reference numeral 610 denotes a protective film.

As a material constituting the buffer layer 602, AlN, AlGaN, and GaN are preferably used. As a material constituting the group III nitride semiconductor intermediate layer 603, the n-type group III nitride semiconductor layer 604, the group III nitride semiconductor active layer 605, and the p-type group III nitride semiconductor layer 606, AlGaN, GaN and InGaN are preferably used. It is preferable that silicon (Si) or germanium (Ge) is added in an extremely small amount in the above-described material for the n-type group III nitride semiconductor layer 604, and magnesium (Mg) or zinc (Zn) is added in an extremely small amount in the above-described material for the p-type group III nitride semiconductor layer 606, respectively, for executing control of conductivity. Moreover, the group III nitride semiconductor active layer 605 preferably forms a multiple quantum well (MQW) structure of the above-described materials. Furthermore, an illumination device can be configured by using the above-described light-emitting diode (LED).

Figure 7A:
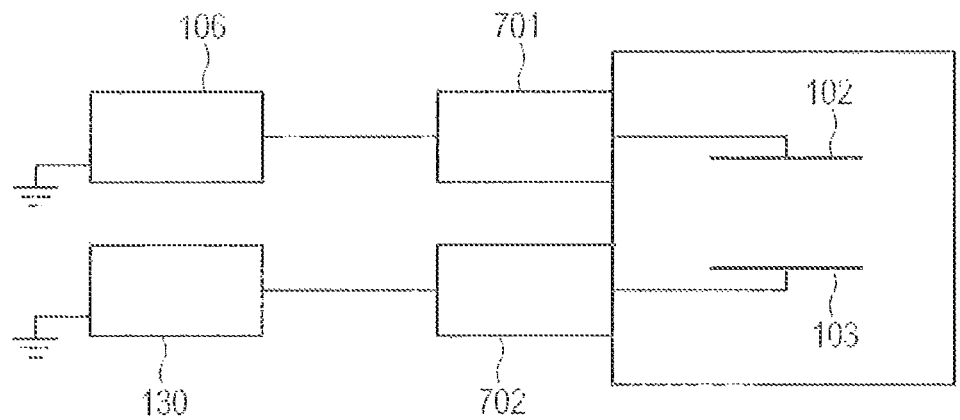
FIG. 7A is a diagram for explaining frequency interference suppressing means according to one embodiment of the present invention.
Figure 7B:
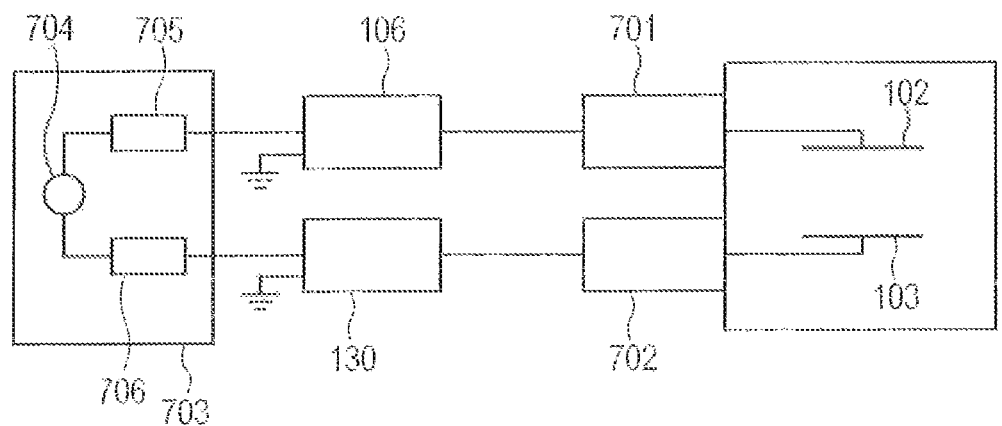
FIG. 7B is a diagram for explaining the frequency interference suppressing means according to one embodiment of the present invention.

FIGS. 7A and 7B are diagrams for explaining frequency interference suppressing means according to the embodiment of the present invention.

FIG. 7A is an example of means for suppressing frequency interference (frequency interference suppressing means) which will be described later by using high-frequency power supplies at different frequencies as the high-frequency power supply 106 for sputtering and the high-frequency power supply 130 for bias. Reference numerals 701 and 702 illustrate matching boxes. The high-frequency power from the high-frequency power supply 106 for sputtering is supplied to the target electrode 102 with a reflective wave being reduced by going through the matching box 701, while the high-frequency power from the high-frequency power supply 130 for bias is supplied to the bias electrode 103 with a reflective wave being reduced by going through the matching box 702. The high-frequency power supply 106 for sputtering and the high-frequency power supply 130 for bias are set so as to have different frequencies. For example, if the frequency of the high-frequency power supply 106 for sputtering is set to 13.56 MHz, by using a frequency of 13.54 MHz or 13.58 MHz as the high-frequency power supply 130 for bias, the frequency interference which will be described later can be suppressed.

FIG. 7B illustrates as example of means for suppressing frequency interference which will be described later (frequency interference suppressing means) by adjusting a phase of the high-frequency power from the high-frequency power supply 106 for sputtering and from the high-frequency power supply 130 for bias. In FIG. 7B, reference numeral 703 denotes a phase control unit, reference numeral 704 denotes a high-frequency oscillator, and reference numeral 705 and reference numeral 706 denote phase adjustment circuits. The high-frequency power from the high-frequency power supply 106 for sputtering is supplied to the target electrode 102 with a reflective wave being reduced by going through the matching box 701, while the high-frequency power from the high-frequency power supply 130 for bias is supplied to the bias electrode 103 with a reflective wave being reduced by going through the matching box 702.

The phase control unit 703 has the high-frequency oscillator 704 and the phase adjustment circuits 705 and 706, and can adjusts a phase of a high-frequency signal from the high-frequency oscillator 704 by the phase adjustment circuits 705 and 706 to output to an external circuit. Moreover, an output portion of the phase control unit 703 is connected to an external input terminal portion of the high-frequency power supply 106 for sputtering and the high-frequency power supply 130 for bias. By means of a high-frequency signal which is output by the phase control unit 703 and the phase of which is adjusted (that is, a high-frequency signal oscillated by the high-frequency oscillator 704, and moreover a high-frequency signal whose phase is adjusted by the phase adjustment circuits 705 and 706), a phase of the high-frequency power output from the high-frequency power supply 106 for sputtering and the high-frequency power supply 130 for bias is controlled. For example, by adjusting the phase control unit 703 and by setting a phase difference of the high-frequency power output from the high-frequency power supply 106 for sputtering and the high-frequency power supply 130 for bias to a phase difference of 180° or the like, frequency interference which will be described later can be suppressed.

In order to prevent frequency interference which will be described later from occurring as described above, setting the high-frequency power supplied to the target electrode 102 and the high-frequency power supplied to the bias electrode 103 so as to have different frequencies or keeping the high-frequency power supplied to the target electrode 102 and the high-frequency power supplied to the bias electrode 103 at a predetermined phase difference are effective means. In order to obtain the effect of the present invention with high reproducibility, provision of these frequency interference suppressing means is extremely effective.

An epitaxial film forming method of a group III nitride semiconductor thin film by using the sputtering apparatus according to the present invention will be described below by referring to the attached drawings. In this embodiment, an epitaxial film is formed on an α-Al$_2$O$_3$ substrate by a method having the following first to fourth steps. In the following description, the substrate holder 111 is assumed to refer to any one of the substrate holders 111a, 111b, and 111c, and the bias electrode 103 is assumed to refer to the bias electrode 103a or 103b, or a common electrode 403 provided in any one of the substrate holders 111 (111a, 111b, and 111c).

First, as the first step, the substrate 107 is introduced into the vacuum vessel 101 maintained at a predetermined pressure by the evacuation mechanism 110. At this time, the substrate (α-Al$_2$O$_3$ substrate) 107 is conveyed to the upper part of the substrate holder 111 by a conveyer robot, not shown, and is held at an upper part of a lift pin, not shown, protruding from the substrate holder 111. After that, the lift pin holding the substrate 107 is lowered, and the substrate 107 is placed on the substrate holder 111.

Subsequently, as the second step, a voltage to be applied to the heater electrode 104 incorporated in the substrate holder 111 is controlled so as to maintain the substrate 107 at a predetermined temperature. At this time, control is executed such that the temperature of the substrate holder 111 is monitored by using a thermocouple (not shown) incorporated in the substrate holder 111 or the temperature of the substrate holder 111 is monitored by using a pyrometer, not shown, installed in the vacuum vessel 101 so that the temperatures become predetermined temperatures.

Subsequently, as the third step, either of an N$_2$ gas or a mixed gas of an N$_2$ gas and a rare gas is introduced into the vacuum vessel 101 from the gas introduction mechanism 109, and the pressure of the vacuum vessel 101 is set to a predetermined pressure by a mass flow controller (not shown) and a variable conductance valve (not shown).

Lastly, as the fourth step, by applying a high-frequency bias power to the bias electrode 103 incorporated in the substrate holder 111 and by applying a high-frequency power to the target 108 by the high-frequency power supply 106 for sputtering, plasma is generated on a front surface of the target 108. As a result, an ion in the plasma throws out elements constituting the target 108, and a group III nitride semiconductor thin film is formed on the substrate 107 by the thrown out elements.

The predetermined pressure in the first step is preferably less than $5 \times 10^{-4}$ Pa and if the pressure is not smaller than that, many impurities such as oxygen and the like are taken into the group III nitride semiconductor thin film, and it is difficult to obtain a favorable epitaxial film. Moreover, the temperature of the substrate holder 111 in the first step is not particularly limited, but from the viewpoint of productivity, a temperature for obtaining a substrate temperature during film forming is preferably set.

The predetermined temperature in the second step is preferably set to a film forming temperature in the fourth step from the viewpoint of productivity, and the predetermined pressure in the third step is preferably set to a film forming pressure in the fourth step from the viewpoint of productivity. Operation timings of the second step and the third step may be exchanged or they may be performed at the same time. Moreover, the temperature set in the second step and the pressure set in the third step are preferably maintained at least until the fourth step is started from the viewpoint of productivity.

In the fourth step, the high-frequency bias power to be applied to the bias electrode 103 needs to be set to predetermined power with which a group III nitride semiconductor film (a group III nitride semiconductor thin film with +c polarity) with high unification degree of +c polarity can be obtained. If power is too small, a group III nitride semiconductor thin film in which polarities are mixed is formed, while if power is too large, the group III nitride semiconductor thin film is damaged by collision with high-energy particles, and a good quality group III nitride semiconductor thin film cannot be obtained.

In this description, a group III nitride semiconductor thin film in which −c polarity is not present or reduced, that is a group III nitride semiconductor thin film in which mixture of the +c polarity and the −c polarity is reduced, and a unification degree of the +c polarity is high is called "a group III nitride semiconductor thin film with +c polarity".

Moreover, the substrate temperature when the fourth step is performed is preferably set within a range of 100 to 1200° C., or more preferably within a range of 100 to 1000° C. If it is less than 100° C., a film in which an amorphous structure is mixed is formed easily, while if it is higher than 1200° C., a film itself is not formed or even if a film is formed, an epitaxial film with many defects is obtained easily due to heat stress. Moreover, a film forming pressure is preferably set within a range of 0.1 to 100 mTorr ($1.33 \times 10^{-2}$ to $1.33 \times 10^{1}$ Pa), or more preferably set within a range of 0.1 to 10 mTorr ($1.33 \times 10^{-1}$ to 1.33 Pa).

If it is less than 0.1 mTorr ($1.33 \times 10^{-2}$ Pa), high energy particles can easily enter the substrate surface, and thus it is difficult to obtain a good quality group III nitride semiconductor thin film, while if the pressure is higher than 100 mTorr ($1.33 \times 10^{1}$ Pa), a film-forming speed becomes extremely low, which is not preferable. When the fourth step is to be started, it is possible to temporarily raise the pressure of the vacuum vessel 101 to the film-forming pressure or more so as to promote generation of plasma on the target side. In this case, the film-forming pressure may be raised by temporarily introducing a large gas flow rate of at least one type of process gases or by temporarily decreasing an opening degree of the variable conductance valve (not shown).

In the fourth step, the timing to apply high-frequency bias power to the bias electrode 103 and the timing to apply high-frequency power to the target electrode 102 may be the same or may be set such that one is applied first and then, the other is applied. However, if the high-frequency power is to be applied to the target electrode 102, first, the high-frequency bias power needs to be applied to the bias electrode 103 before a film formation surface of the $\alpha$-Al$_2$O$_3$ substrate 107 is covered by a crystal layer made of a group III nitride semiconductor.

The crystal layer of the group III nitride semiconductor formed in a state where the high-frequency bias power is not applied to the bias electrode 103 is easily brought into a state in which polarities are mixed or a state of −c polarity. If a state in which the −c polarity is mixed occurs, it is difficult to obtain the group III nitride semiconductor thin film with +c polarity even if the high-frequency bias power is applied to the bias electrode 103 after that. Therefore, if the high-frequency power is to be applied to the target electrode 102, first, it is preferable that the high-frequency power is applied to the target electrode 102 and immediately after plasma is generated on the front surface of the target (that is, after sputtering is started), the high-frequency bias power is applied to the bias electrode 103 and before a crystal layer made of the group III nitride semiconductor is formed on the $\alpha$-Al$_2$O$_3$ substrate 107, the high-frequency bias power is applied to the bias electrode 103.

If the high-frequency bias power is to be applied to the bias electrode 103, first, plasma is generated on the surface side of the $\alpha$-Al$_2$O$_3$ substrate 107 during a period until the high-frequency power is applied to the target electrode 102, and surface nitridization of the $\alpha$-Al$_2$O$_3$ substrate 107 caused by an active species containing an N atom in the plasma needs to be avoided. That is because, if the surface of the $\alpha$-Al$_2$O$_3$ substrate 107 is nitrided, AlN with −c polarity or with mixed polarity is easily formed on the substrate surface and even if the high-frequency power is applied to the target electrode 102 after that so as to form the group III nitride semiconductor thin film, it becomes difficult to obtain a group III nitride semiconductor thin film with +c polarity. Therefore, if the high-frequency bias power is to be applied to the bias electrode 103, first, it is preferable that the high-frequency power is applied to the target electrode 102 immediately after the high-frequency bias power is applied to the bias electrode 103 and then, sputtering is started.

Moreover, it is needless to say that before the first step, such a step may be provided in which the substrate 107 is conveyed to a pre-treatment chamber (not shown) for thermal treatment or plasma processing of the substrate 107 at a temperature of the film-forming temperature or more. However, if the plasma processing is to be performed, it is important to select a condition that an AlN layer with mixed polarity or an AlN layer with −c polarity is not formed on the surface of the $\alpha$-Al$_2$O$_3$ substrate.

A mechanism of forming a group III nitride semiconductor thin film with +c polarity by the above-described first to fourth steps will be described below by using FIG. 5. As the first and second steps, the $\alpha$-Al$_2$O$_3$ substrate 107 is placed on the substrate holder 111 so that the substrate is at a predetermined temperature, and as the third step, either of an N$_2$ gas or a mixed gas of an N$_2$ gas and a rare gas is introduced into the vacuum vessel. Subsequently, as the fourth step, high-frequency bias power is applied to the bias electrode, and also plasma is generated on the target side so as to form a group III nitride semiconductor thin film.

If a metal target is used as a target in the fourth step, it is considered that the target surface is nitrided by an active species containing an N atom, and by sputtering the surface with a positive ion, a nitride molecule 503 illustrated in FIG. 5 is emitted from the target surface to reach the surface of the α-Al$_2$O$_3$ substrate 107. Moreover, even if a nitride target is used, it is considered that by sputtering the surface with a positive ion, a nitride molecule 503 illustrated in FIG. 5 is emitted from the target surface to reach the surface of the α-Al$_2$O$_3$ substrate 107. A nitride molecule 503 of a 2-atom molecule is illustrated in FIG. 5 for simplification, but the molecule is not limited to a 2-atom molecule as long as it is a nitride molecule.

In FIG. 5, high-frequency bias power is applied to the bias electrode 103, and in a space facing the surface side of the α-Al$_2$O$_3$ substrate 107, a plasma region indicated by reference numeral G and a sheath region indicated by reference numeral S are formed. The sheath region S is formed between the plasma region G and the α-Al$_2$O$_3$ substrate 107.

In the plasma region G, densities of a positive charge (positive ion) and a negative charge (electron) are substantially equal and substantially in an electrically neutral state. Moreover, the plasma region G is usually in a substantially constant potential state (called plasma potential) which is positive with respect to grounding potential. On the other hand, since a positive ion and an electron are different in ease of follow-up with respect to a change in a high-frequency electric field generated by application of the high-frequency bias power, excessive electrons are supplied to the surface of the α-Al$_2$O$_3$ substrate 107, and a negative DC bias voltage is generated. In the sheath region S, an electric field indicated by reference numeral E in a direction toward the surface of the α-Al$_2$O$_3$ substrate 107 is generated by a potential difference between the negative potential on the surface of the α-Al$_2$O$_3$ substrate 107 generated as above and the plasma potential of the plasma region G. The size of this electric field E can be adjusted by magnitude of the high-frequency bias power.

As a mode of power to be applied to the bias electrode 103, high-frequency power is preferable. In the case of DC power, since the α-Al$_2$O$_3$ substrate 107 is an insulating material, it becomes difficult to effectively generate a negative DC bias voltage on the surface of the α-Al$_2$O$_3$ substrate 107, which is not preferable.

The nitride molecule 503 has a group III element 503a and an N atom 503b, and the group III element 503a has positive charge biased and the N atom 503b has negative charge biased. That is, the nitride molecule 503 has polarization indicated by reference numeral P. This nitride molecule 503 is considered to be oriented in random directions in the plasma region G, but when it reaches the sheath region S, the electric field E acts on the polarization P of the nitride molecule 503, and it is considered that the group III element 503a is oriented in the direction of the α-Al$_2$O$_3$ substrate and the N atom 503b is oriented in the direction of the plasma region G, that is, the polarization P is oriented to the direction of the α-Al$_2$O$_3$ substrate.

In the group III nitride semiconductor with +c polarity, the polarization P of the nitride molecule 503 is oriented to the direction of the α-Al$_2$O$_3$ substrate. That is, it is considered that the polarization P of the nitride molecule 503 is oriented to the direction of the α-Al$_2$O$_3$ substrate by the electric field E of the sheath region S generated by application of the high-frequency bias power, and by means of adsorption to the α-Al$_2$O$_3$ substrate surface while the orientation is maintained, a group III nitride semiconductor thin film with +c polarity is obtained.

Even if the high-frequency bias power is applied to the bias electrode 103, if the high-frequency bias power is small, a group III nitride semiconductor with +c polarity might not be obtained. A possible reason for this is that the electric field E of the sheath region S does not sufficiently act on the polarization P of the nitride molecule 503 and fails to control its orientation.

Moreover, if the high-frequency bias power is too large, a high-quality group III nitride semiconductor might not be obtained. The reason for that is considered to be that the positive ion in the plasma is accelerated by the electric field E in the sheath region S and collides against the surface of the α-Al$_2$O$_3$ substrate with large energy, and thus many defects are formed inside the group III nitride semiconductor thin film.

As described above, in order to obtain a group III nitride semiconductor thin film with +c polarity, it is necessary to adjust the magnitude of the high-frequency bias power to be applied to the bias electrode 103 to an appropriate value. An optimal range of this high-frequency bias power is different largely depending on the internal structure of the sputtering apparatus, and thus an optimal condition needs to be acquired for each apparatus.

Moreover, a frequency used as the high-frequency bias power is not particularly limited, but if the frequency of the high-frequency bias power and the frequency of the high-frequency power applied to the target match each other, a low-frequency beat phenomenon caused by interference of high-frequency power may easily occur, and a film-forming condition might be also affected (hereinafter this low-frequency beat phenomenon is called frequency interference). If frequency interference occurs in this embodiment, plasma becomes unstable and the DC bias voltage generated on the surface of the α-Al$_2$O$_3$ substrate no longer becomes stable, and thus high frequency power at a different frequency is preferably used. By using FIG. 7A as an example, assuming that a frequency of high-frequency power to be applied to the target electrode 102 (a frequency of the high-frequency power supply 106 for sputtering) is 13.56 MHz, by using 13.54 MHz or 13.58 MHz for the frequency of the high-frequency bias power (frequency of the high-frequency power supply 130 for bias) to be applied to the bias electrode 103, the above-described frequency interference can be prevented or reduced.

Moreover, even if the high-frequency bias power to be applied to the bias electrode and the high-frequency power to be applied to the target have an equal frequency, the above-described frequency interference can be suppressed by making the high-frequency bias power and the high-frequency power out of phase by a predetermined phase difference. By using FIG. 7B as an example, if a phase difference between the high-frequency bias power to be applied to the bias electrode 103 and the high-frequency power to be applied to the target electrode 102 is adjusted to be 180° by the phase control unit 703, that is, if adjustment is made so that a positive peak top voltage of the high-frequency power is applied to the target electrode 102 and at the same time, a negative peak top voltage of the high-frequency bias power is applied to the bias electrode 103, frequency interference can be prevented or reduced most effectively. Moreover, the phase difference may be finely adjusted so that a reflective wave to each of the high-frequency power supplies (high-frequency power supply for sputtering and high-frequency power supply for bias) is further reduced. That is, the phase difference does not have to be 180° exactly, but may be approximately 180° which covers a range of finely-adjusted degrees around 180°.

Moreover, even in the case of other phase difference, it can be used without problem unless frequency interference is caused. If frequency interference as above occurs, the plasma becomes unstable and a reflective wave to each of the high-frequency power supplies (high-frequency power supply for spattering and high-frequency power supply for bias) may easily increase, and thus it is preferable that adjustment is made to such a phase difference that minimizes the frequency interference (preferably to zero).

Even if the high-frequency bias power is not applied to the bias electrode 103, the electric field E is generated in the sheath region S, but the electric field E generated at this time is generally smaller than that generated when the high-frequency bias power is applied. Therefore, the reason why a nitride semiconductor thin film with +c polarity cannot be obtained if the high-frequency bias power is not applied to the bias electrode 103 is considered to be that the electric field E of the sheath region S does not sufficiently act on the polarization P of the nitride molecule 503 and cannot control its orientation.

When the metal target 108 is to be sputtered by plasma using a mixed gas of an $N_2$ gas and a rare gas, a ratio in the mixed gas of the $N_2$ gas and the rare gas should be controlled so that a metal component (non-nitride component) is not taken in the group III nitride semiconductor than film in a large amount. If a large amount of the metal component is taken in the ratio of a metal atom or the group III element emitted from the target in a metal cluster state tends to become larger than the nitride molecule 503, and thus it is likely that the effect of the present invention cannot be fully obtained even if the high-frequency bias power is applied to the bias electrode 103.

As the epitaxial film of the group III nitride semiconductor thin film formed by the method in this embodiment, the better layer 602, the group III nitride semiconductor intermediate layer 603, the n-type group III nitride semiconductor layer 604, the group III nitride semiconductor active layer 605, and the p-type group III nitride semiconductor layer 606 illustrated in FIG. 6 can be cited. All of the above-described layers may be fabricated by using the sputtering apparatus (epitaxial firm forming method) according to the present invention or only limited layers may be fabricated by using the sputtering apparatus (epitaxial film forming method) according to the present invention.

As a first example, for example, there is a method of fabricating an epitaxial wafer by fabricating the buffer layer 602 cut an LED element in FIG. 6 by using the sputtering apparatus (epitaxial film forming method) according to the present invention and then, by sequentially laminating the group III nitride semiconductor intermediate layer 603, the n-type group III nitride semiconductor layer 604, the group III nitride semiconductor active layer 605, and the p-type group III nitride semiconductor layer 606 by using the MOCVD method.

As a second example, there is a method of fabricating an epitaxial wafer by fabricating the buffer layer 602 and the group III nitride semiconductor intermediate layer 603 by using the sputtering apparatus (epitaxial film forming method) according to the present invention and then, by sequentially laminating the n-type group III nitride semiconductor layer 604, the group III nitride semiconductor active layer 605, and the p-type group III nitride semiconductor layer 606 by using the MOCVD method.

As a third example, there is a method of fabricating an epitaxial wafer by fabricating the buffer layer 602, the group III nitride semiconductor intermediate layer 603, and the n-type group III nitride semiconductor layer 604 by using the sputtering apparatus (epitaxial film forming method) according to the present invention and then, by sequentially laminating the group III nitride semiconductor active layer 605 and the p-type group III nitride semiconductor layer 606 by using the MOCVD method.

As a fourth example, there is a method of fabricating an epitaxial wafer by fabricating the buffer layer 602, the group III nitride semiconductor intermediate layer 603, the n-type group III nitride semiconductor layer 604, and the group III nitride semiconductor active layer 605 by using the sputtering apparatus (epitaxial film forming method) according to the present invention and then, by fabricating the p-type group III nitride semiconductor layer 606 by using the MOCVD method.

As a fifth example, there is a method of fabricating an epitaxial wafer by fabricating the buffer layer 602, the group III nitride semiconductor intermediate layer 603, the n-type group III nitride semiconductor layer 604, the group III nitride semiconductor active layer 605, and the p-type group III nitride semiconductor layer 606 by using the sputtering apparatus (epitaxial film forming method) according to the present invention.

On the epitaxial wafer obtained as above, by forming the translucent electrode 607, the p-type bonding pad electrode 609, the n-type electrode 608, and the protective film 610 as illustrated in FIG. 6 by using the lithography technology and RIE (reactive ion etching) technology, an LED structure can be obtained. The material for the translucent electrode 607, the p-type bonding pad electrode 609, the n-type electrode 608, and the protective film 610 is not particularly limited but materials well-known in this technical field can be used without limitation.

EXAMPLE

First Example

As a first example of the present invention, an example will be described in which an AlN film as the buffer layer 602 (See FIG. 6) is formed on an $\alpha$-$Al_2O_3$ (0001) substrate by using the film-forming method of a group III nitride semiconductor thin film according to an embodiment of the present invention. More specifically, an example will be described in which the AlN film is formed on the $\alpha$-$Al_2O_3$ (0001) substrate by using the sputtering method in a state where the high-frequency bias power is applied to the bias electrode 103. In the first example, the AlN film is formed by using the sputtering apparatus similar to that in FIG. 1. Moreover, the frequencies of the high-frequency power to be applied to the target electrode 102 and the high-frequency power to be applied to the bias electrode 103 are set to 13.56 MHz and 13.54 MHz, respectively.

In the first example, first, the $\alpha$-$Al_2O_3$ (0001) substrate is conveyed to the vacuum vessel 101 maintained at $1\times10^{-4}$ Pa or less and placed on the substrate holder 111 by the first step, and the substrate is maintained at 550° C. which is a film-forming temperature by the second step. At this time, a current made to flow to the heater electrode 104 is controlled so that a monitor value of the thermocouple incorporated in the substrate holder 111 is at 750° C.

Subsequently, by the third step, a mixed gas of an $N_2$ gas and an Ar gas is introduced so that $N_2/(N_2+Ar)$: 25% is realized, and the pressure of the vacuum vessel 101 is set to 3.75 mTorr (0.5 Pa). In this state, the high-frequency bias power at 10 W is applied to the bias electrode 103 by the fourth step, and also the high-frequency power at 2000 W is applied from the high-frequency power supply 106 for sputtering to the target 108 made of metal Al. Thus, an AlN film having a film thickness of 50 nm is formed on the substrate by the sputtering method. It is confirmed by X-ray photoelectron spectroscopy (XPS) that the AlN film obtained at this time contains almost no metal Al component.

As for the film-forming temperature in the first example, substrate temperature measurement is conducted in advance by using an $\alpha$-$Al_2O_3$ (0001) substrate in which the thermocouple is embedded, and then the film-forming temperature is set based on a relationship between the obtained temperature of the $\alpha$-$Al_2O_3$ (0001) substrate and the obtained monitor value of the thermocouple incorporated in the heater, that is, the obtained temperature of the heater.

In the first example, the fabricated AlN film is evaluated by X-ray diffraction (XRD) measurement in a 2θ/ω scan mode at a symmetric reflection position, XRC measurement in a ω scan mode for the symmetric plane, the XRC measurement in a φ scan mode in In-plane arrangement, and coaxial impact collision ion scattering spectroscopy (CAICISS) measurement. Here, the XRD measurement in the 2θ/ω scan mode at a symmetric reflection position is used for checking crystal orientation, and the XRC measurement in the ω scan mode for the symmetric plane and the XRC measurement in the φ scan mode in In-plane arrangement are used for evaluation of mosaic expansion of tilt and twist, respectively. Moreover, the CAICISS measurement is used as means for determining polarity.

First, the XRD measurement in the 2θ/ω scan mode at a symmetric reflection position is conducted for the AlN film fabricated in the first example using a measurement range of 2θ=20 to 60°, only diffraction peaks of the AlN (0002) plane and the $\alpha$-$Al_2O_3$ (0006) plane are observed, and diffraction peaks indicating other lattice planes of AlN are not observed. From this fact, it is known that the obtained AlN film has c-axis orientation.

Subsequently, the XRC measurement in the ω scan mode for the symmetric plane (AlN (0002) plane in the first example) is conducted for the AlN film fabricated in the first example. The FWHM of the obtained XRC profile is 450 arcsec or less if a detector is in an open detector state and 100 arcsec or less if an analyzer crystal is inserted into the detector. Thus, it is confirmed that mosaic expansion of tilt in the fabricated AlN film is small. Moreover, depending on the fabrication conditions, those with the FWHM at 20 arcsec or less in the XRC measurement with the analyzer crystal inserted into the detector are also obtained.

The XRC measurement should be conducted by the detector in the open detector state, but in the case of a sample with a small film thickness as in the first example, the FWHM of the XRC profile expands due to film thickness effect or lattice relaxation, and accurate evaluation of mosaic expansion becomes difficult. Thus, in recent years, the case with the analyzer crystal inserted into the detector is also handled as the XRC measurement in a wide sense as above. Unless otherwise noted, it is assumed below that the open detector state is used in the XRC measurement.

Subsequently, the XRC measurement in the φ scan mode in In-plane arrangement is made for the AlN film fabricated in the first example. The AlN {10-10} plane is used for the measurement. Six diffraction peaks appears at 60° intervals in the obtained XRC profile, and it is confirmed that the AlN film has six-time symmetry, that is, the AlN film epitaxially grows. Moreover, the FWHM acquired from the diffraction peak with the maximum magnitude is 2.0° or less, and it is known that mosaic expansion of twist of the fabricated AlN film is relatively small. When the $\alpha$-$Al_2O_3$ (0001) substrate and the in-plane crystal orientation of the AlN film are compared, it is confirmed that an a-axis of the AlN film makes in-plane rotation at 30° with respect to the a-axis of the $\alpha$-$Al_2O_3$ (0001) substrate. This indicates that the AlN film is formed with a general epitaxial relationship in an epitaxial growth of the AlN film on the $\alpha$-$Al_2O_3$ (0001) substrate.

Subsequently, the CAICISS measurement is conducted for the AlN film fabricated in the first example. In this measurement, an Al signal is detected from an AlN [11-20] orientation with an incident angle changed, and it is known that a peak in the vicinity of the incident angle of 70° is obtained in a single peak form. This indicates that the obtained AlN film has +c polarity.

As described above, it can be confirmed that the AlN film fabricated in the first example is a c-axis orientation epitaxial film with +c polarity and with small mosaic expansion of tilt. That is, according to the present invention, it is made clear that a group III nitride semiconductor thin film with +c polarity could be obtained while mosaic expansion of tilt and twist is reduced. If the experiment similar to the first example is repeated several times, it can be confirmed that reproducibility is favorable.

Second Example

Subsequently, as a second example of the present invention, an example will be described in which the AlN film fabricated by using the film-forming method of the group III nitride semiconductor thin film according to the present invention is used as a buffer layer and an undoped GaN film as the group III nitride semiconductor intermediate layer 603 in FIG. 6 is formed on the buffer layer by using the MOCVD method.

The AlN film is formed on the $\alpha$-$Al_2O_3$ (0001) substrate by using the sputtering method with the same apparatus and conditions as those in the first example and then, a wafer (substrate) is introduced into the MOCVD device so as to form an undoped GaN film having a film thickness of 5 μm.

The surface of the obtained undoped GaN film is a mirror surface, and the result of the XRD measurement in the 2θ/ω scan mode at a symmetric reflection position indicates that the undoped GaN film has a c-axis orientation. Subsequently, the XRC measurement in the ω scan mode using the GaN (0002) plane as the symmetric plane and the XRC measurement in the φ scan mode in In-plane arrangement for the GaN {10-10} plane are conducted, and it is confirmed that the FWHMs of these measurements are 250 arcsec or less and 500 arcsec or less, respectively. From this fact, it is known that the obtained undoped GaN film is obtained as a high-quality crystal with small mosaic expansion of tilt and twist. Moreover, from the CAICISS measurement, it is confirmed that the polarity of the obtained undoped GaN film is +c polarity. This can be considered to be the result that, as described in the first example, the polarity of the AlN film used as the buffer layer can be controlled to the +c polarity, and thus the undoped GaN film formed on the buffer layer also takes over the polarity.

As described above, by using the AlN film fabricated by using the film-forming method of the group III nitride semiconductor thin film according to the present invention and controlled to the +c polarity as the buffer layer, the undoped GaN film grown by using the MOCVD method on the buffer layer can be obtained as a high-quality epitaxial film controlled to +c polarity with small mosaic expansion. That is, a group III nitride semiconductor thin film with +c polarity can be epitaxially grown on the $\alpha$-$Al_2O_3$ substrate.

In the second example, the undoped GaN film is formed by the MOCVD method, but a similar result can be obtained by using the sputtering method, too. Moreover, if the experiment similar to the second example is repeated several times, it can be confirmed that reproducibility is favorable.

Third Example

As a third example of the present invention, an example will be described in which: the AlN film fabricated by using the film-forming method of the group III nitride semiconductor thin film according to the present invention is used as a buffer layer; the group III nitride semiconductor intermediate layer made of undoped GaN, the n-type group III nitride semiconductor layer made of Si doped GaN, the group III nitride semiconductor active layer having an MQW structure of InGaN and GaN, and the p-type group III nitride semiconductor layer made of Mg doped GaN are epitaxially grown sequentially on the buffer layer by using the MOCVD method; then the n-type electrode layer, the translucent electrode, the p-type electrode layer, and the protective film are formed; and thereafter, the wafer is separated by scribing to fabricate an LED element.

By using the sputtering method, the AlN film as the buffer layer 602 is formed on the $\alpha$-$Al_2O_3$ (0001) substrate under the same conditions as those of the first example. After that, the wafer is introduced into the MOCVD device, and the group III nitride semiconductor intermediate layer 603 made of undoped GaN having a film thickness of 5 μm and the n-type group III nitride semiconductor layer 604 made of Si doped GaN having a film thickness of 2 μm are formed. Moreover, the group III nitride semiconductor active layer 605 having the MQW structure which is a lamination structure having 5 layers of InGaN with a film thickness of 3 nm and 6 layers of GaN with a film thickness of 16 nm being alternately laminated starting with GaN and ending with GaN, and the p-type group III nitride semiconductor layer 606 made of Mg Doped GaN having a film thickness of 200 nm are formed.

On the obtained epitaxial wafer, the translucent electrode 607, the p-type bonding pad electrode 609, the n-type electrode 608, and the protective film 610 are formed by using the lithography technology and the RIE technology as illustrated in FIG. 6. In the third example, ITO (Indium-Tin-Oxide) is used as the translucent electrode, a structure in which Titanium (Ti), Al, and gold (Au) are laminated as the p-type bonding pad electrode, a structure in which nickel (Ni), Al, Ti, and Au are laminated as the n-type electrode, and $SiO_2$ as the protective film.

The wafer on which the LED structure obtained as above is formed is separated by scribing into an LED chip of 350 μm square, and this LED chip is placed on a lead frame and is connected to the lead frame by a gold wire so as to have an LED element.

When a forward current is made to flow through the p-type bonding pad electrode and the n-type electrode of the obtained LED element, the LED element shows favorable emission characteristics at a current of 20 mA of a forward voltage of 3.0 V, an emission wavelength of 470 nm, and an emission output of 15 mW. Such characteristics are obtained without variation among the LED elements fabricated from the substantially entire surface of the fabricated wafer.

As described above, an LED element having favorable emission characteristics could be obtained by using, as the buffer layer 602, the AlN film, which is fabricated by use of the film-forming method of the group III nitride semiconductor thin film according to the present invention and thereby controlled to the +c polarity. In the third example, the group III nitride semiconductor intermediate layer 603 made of undoped GaN, the n-type group III nitride semiconductor layer 604 made of Si doped GaN, the group III nitride semiconductor active layer 605 having the MQW structure of InGaN and GaN, and the p-type group III nitride semiconductor layer 606 made of Mg Doped GaN are formed by the MOCVD method, but the similar results can be obtained by fabricating these layers by using the sputtering method. Moreover, if the experiment similar to the third example is repeated several times, it can be confirmed that reproducibility is favorable.

First Comparative Example

As a first comparative example of the present invention, an example will be described in which the AlN film as a buffer layer is formed on the $\alpha$-$Al_2O_3$ (0001) substrate by using the sputtering meshed without applying the high-frequency bias power to the bias electrode, which is the distinctive feature of the present invention. In the first comparative example, the AlN film is formed by using the same sputtering apparatus 1, substrate holder 111, and film-forming conditions as those in the first example except that the high-frequency bias power is not applied to the bias electrode 103. Moreover, the frequency of the high-frequency power to be applied to the target electrode 102 is set to 13.56 MHz.

The AlN film fabricated in the first comparative example is measured in the XRD measurement in the 2θ/ω scan mode at a symmetric reflection position, the XRC measurement in the ω scan mode for the AlN (0002) plane (when an analyzer crystal is inserted in the detector and in an open detector state), and the XRC measurement in the φ scan mode for AlN {10-10} plane, and the measurement results show that an epitaxial film with c-axis orientation is obtained as in the AlN film obtained in the first example, and mosaic expansion of tilt and twist is at the same degree. On the other hand, when the CAICISS measurement is made for the AlN film fabricated in the first comparative example, the measurement result shows that +c polarity and −c polarity are mixed in the film.

As described above, if a film is formed without applying high-frequency bias power to the bias electrode 103, the group III nitride semiconductor thin film with +c polarity cannot be obtained. Even if the experiment similar to this comparative example is repeated several times, it is difficult to obtain the AlN film with +c polarity.

Second Comparative Example

Subsequently, as a second comparative example of the present invention, an example will be described in which a buffer layer made of AlN is formed on the $\alpha$-$Al_2O_3$ (0001) substrate by using the sputtering method without applying the high-frequency bias power to the bias electrode 103 and an undoped GaN film as a group III nitride semiconductor intermediate layer is formed on she buffer layer by using the MOCVD method. In the second comparative example, the buffer layer made of AlN is formed by using the same sputtering apparatus 1, substrate holder 111, and film-forming conditions as those in the first comparative example, and the undoped GaN film is formed under the same conditions as those in the second example.

A film of a buffer layer made of AlN is formed on the $\alpha$-$Al_2O_3$ (0001) substrate by using the sputtering method using the same sputtering apparatus 1, substrate holder 111, and film-forming conditions as those in the first comparative example, and after that, the wafer is introduced into the MOCVD device, and the undoped GaN film having a film thickness of 5 μm is formed.

The surface of the obtained undoped GaN film is cloudy, and the XRD measurement in the 2θ/ω scan mode at a symmetric reflection position shows that the undoped GaN film has c-axis orientation. Subsequently, the XRC measurement in the ω scan mode using the GaN (0002) plane as a symmetric plane and the XRC measurement in the φ scan mode for GaN {10-10} plane in the In-plane arrangement are made, and it is confirmed that the FWHMs of these measurements are approximately 600 arcsec and 1000 arcsec, respectively. From this fact, it is known that the undoped GaN film obtained by the second comparative example is obtained as a low-quality crystal with mosaic expansion of tilt and twist larger than that of the undoped GaN film obtained in the second example.

Moreover, it is confirmed by the CAICISS measurement that the obtained undoped GaN film is a film in which +c polarity and −c polarity are mixed. This can be considered as the result that, as explained in the first comparative example, the buffer layer made of AlN is a film in which the +c polarity and the −c polarity are mixed, and therefore the undoped GaN firm formed on the buffer layer takes over the mixed polarity of the buffer layer.

As described above, if the buffer layer made of AlN is formed on the $\alpha$-$Al_2O_3$ (0001) substrate by using the sputtering method without applying the high-frequency bias power to the bias electrode, the undoped GaN film grown on the buffer layer by using the MOCVD method is obtained as a low-quality epitaxial film. Though the undoped GaN film is formed by the MOCVD method in the second comparative example, it can be seen that the similar result is obtained as well even when the sputtering method is used. Moreover, even if the experiment similar to this comparative example is repeated several times, it is difficult to obtain a GaN film with a mirror surface and favorable crystalline.

Third Comparative Example

As a third comparative example of the present invention, an example will be described in which a buffer layer made of AlN is formed on the $\alpha$-$Al_2O_3$ (0001) substrate by using the sputtering method without applying the high-frequency bias power to the bias electrode and on the buffer layer, the group III nitride semiconductor intermediate layer made of undoped GaN, the n-type group III nitride semiconductor layer made of Si doped GaN, the group III nitride semiconductor active layer having the MQW structure of InGaN and GaN, and the p-type group III nitride semiconductor layer made of Mg Doped GaN are epitaxially grown sequentially by using the MOCVD method; moreover, after the n-type electrode layer, the translucent electrode, the p-type electrode layer, and the protective film are formed, and thereafter the wafer is separated by scribing to fabricate an LED element.

The film-forming method of the buffer layer made of AlN is the same as that in the first comparative example, and the materials and film-forming method of the group III nitride semiconductor intermediate layer made of undoped GaN, the n-type group III nitride semiconductor layer made of Si doped GaN, the group III nitride semiconductor active layer having the MQW structure of InGaN and GaN, and the p-type group III nitride semiconductor layer made of Mg doped GaN whose films are formed by using the MOCVD method and the n-type electrode layer, the translucent electrode, the p-type electrode layer, and the protective film formed after that and the step of making an element after that are all the same as those in the third example.

When a forward current is made to flow through the p-type bonding pad electrode and the n-type electrode of the obtained LED element, the LED element does not exhibit favorable diode characteristics, nor achieves sufficient emission intensity in a visible light region and the like. It is difficult to obtain favorable element characteristics. Such characteristics are obtained without variation among the LED elements fabricated from the substantially entire surface of the fabricated wafer.

As described above, if is difficult to obtain an LED element having favorable emission characteristics if a buffer layer made of AlN is formed on the $\alpha$-$Al_2O_3$ (0001) substrate by using the sputtering method without applying the high-frequency bias power to the bias electrode. In this example, the group III nitride semiconductor intermediate layer made of undoped GaN, the n-type group III nitride semiconductor layer made of Si doped GaN, the group III nitride semiconductor active layer having the MQW structure of InGaN and GaN, and the p-type group III nitride semiconductor layer made of Mg doped GaN are formed by using the MOCVD method. Even by using the sputtering method, however, the similar result is obtained. Moreover, even if the experiment similar to this comparative example is repeated several times, it is difficult to obtain an LED element having favorable emission characteristics.

Fourth Example

As a fourth example of the present invention, an example will be described in which an AlN film is formed on the $\alpha$-$Al_2O_3$ (0001) substrate by using the film-forming method of the group III nitride semiconductor thin film according to the present invention, and by using the same apparatus and conditions as those in the first example, except that the high-frequency power to be applied to the target electrode 102 and the high-frequency power to be applied to the bias electrode 103 are set to both have a frequency of 13.56 MHz, but to be out of phase by 180°.

The experiment of the fourth example is conducted repeatedly, and it is confirmed that an AlN film with +c polarity as in the first example can be obtained with good reproducibility.

Fourth Comparative Example

As a fourth comparative example of the present invention, an example will be described in which an AlN film is formed on the $\alpha$-$Al_2O_3$ (0001) substrate by using the film-forming method of the group III nitride semiconductor thin film according to the present invention, and by using the same apparatus and conditions as those in the first example except that the high-frequency power to be applied to the target electrode 102 and the high-frequency power to be applied to the bias electrode 103 are both set to have a frequency of 13.56 MHz. In the fourth comparative example, the phases of the high-frequency power to be applied to the target electrode 102 and the high-frequency power to be applied to the bias electrode 103 are not controlled.

The experiment of the fourth comparative example is conducted repeatedly. If frequency interference does not occur, an AlN film with +c polarity is obtained. However, if the frequency interference occurs, it is difficult to obtain the AlN film +c polarity.

As described above about the present invention, the major feature of the present invention is to focus on an idea of applying the high-frequency bias power to the bias electrode in forming an epitaxial film of a group III nitride semiconductor by the sputtering method. It is an unprecedented technical idea to generate the electric field of the sheath region S on the firm formation surface side of the substrate by means of application of the high-frequency bias power to the bias electrode, to make the generated electric field to act on polarization of the nitride molecules ejected from the target so as to control their orientation, and to use the orientation to obtain a group III nitride semiconductor thin film with +c polarity and a wurtzite crystal structure.

Moreover, it is also an unprecedented technical idea to obtain a group III nitride semiconductor thin film having +c polarity with good reproducibility by preventing or reducing low-frequency beat caused by interference between the high-frequency power applied to the target electrode and the high-frequency power applied to the bias electrode, that is, frequency interference.

In the present invention, under the technical ideas specific to the present invention, the heater electrode and the bias electrode are provided on the substrate holder. By configuring the substrate holder as above, as illustrated in the above-described first to fourth examples and the first to fourth comparative examples, a group III nitride semiconductor thin film with reduced mosaic expansion of tilt and twist and having +c polarity can be formed by the sputtering method.

In addition, the inventors have found that the application of the foregoing technical ideas to the case of using a substrate material such as a Si (111) substrate or the case of forming a thin film material such as a zinc oxide (ZnO)-based semiconductor film is also effective to obtain a high-quality epitaxial film. Hereinafter, examples will be described in which: a group III nitride semiconductor thin film is formed on a Si (111) substrate by using the film forming method according to the present invention (fifth example); a group III nitride semiconductor thin film is formed on a Si (111) substrate without using the film forming method according to the present invention (fifth comparative example); a ZnO-based semiconductor thin film is formed on an α-Al$_2$O$_3$ (0001) substrate by using the film forming method according to the present invention (sixth example); and a ZnO-based semiconductor thin film is formed on an α-Al$_2$O$_3$ (0001) substrate without using the film forming method according to the present invention (sixth comparative example).

Fifth Example

In a fifth example, an AlN film is formed by using the same method and conditions as those in the first example, except for use of a Si (111) substrate in which a natural oxide film is removed from its surface by treatment with hydrofluoric acid. In the fifth example, a film forming temperature (550° C.) is set based on a result of a substrate temperature measurement which is performed in advance by using a Si (111) substrate in which a thermocouple is embedded.

From a CAICISS measurement and an XRD measurement, it can be confirmed that the AlN film formed on the Si (111) substrate in the fifth example is formed as an epitaxial film with +c polarity. In addition, an undoped GaN film having a film thickness of 2 μm is formed on the obtained AlN film by using the MOCVD method. The obtained undoped GaN film has a mirror surface and is obtained as a single crystal film with c-axis orientation.

Moreover, an LED element and a HEMT element are fabricated by using the obtained undoped GaN film. Then, the obtained element characteristics are relatively favorable as those for the LED element and the HEMT element formed on the Si (111) substrate.

Fifth Comparative Example

In a fifth comparative example, an AlN film is formed on a Si (111) substrate by using the same method and conditions as those in the fifth example except that the high-frequency bias power is not applied to the bias electrode, although the application is the distinctive feature of the present invention. The AlN film consequently obtained is an epitaxial film in which +c polarity and −c polarity are mixed. Moreover, an undoped GaN film having a film thickness of 2 μm is formed on the obtained AlN film by the MOCVD method. Then, the surface of the obtained undoped GaN film is cloudy.

Further, an LED element and a HEMT element are fabricated by using the obtained undoped GaN film. In this case, it is difficult to obtain favorable element characteristics in both the elements.

As described above, the film forming method according to the present invention is also extremely effective means for forming a group III nitride semiconductor thin film having favorable crystalline with +c polarity on a Si (111) substrate Sixth Example In a sixth example, a ZnO film is formed on an α-Al$_2$O$_3$ (0001) substrate with the same method and conditions as those in the first example except for a target material, a process gas, a film forming temperature and a film thickness. The target material is a metal Zn, the process gas is a mixed gas of O$_2$ and Ar (O$_2$+Ar): 25%), the film forming temperature is 800° C. and the film thickness is 100 nm.

The ZnO film in the sixth example is formed as an epitaxial film with the same crystal structure (wurtzite structure) as the group III nitride semiconductor, and with the same c-axis orientation as the group III nitride semiconductor, and the polarity thereof is +c polarity (Zn polarity). Moreover, an epitaxial wafer (LED structure) including a lamination film of an n-type ZnO film and a p-type ZnO film is formed on the obtained ZnO film by using the MBE method, and then an LED element is fabricated by using the lithography technology, the RIE technology, and the like. The obtained element characteristics are favorable as those for the LED element using the ZnO film.

Moreover, an undoped GaN film having a film thickness of 2 μm is formed on the ZnO film in the sixth example by using the MOCVD method. The obtained undoped GaN film has a mirror surface and thus is obtained as a single crystal film with c-axis orientation. Thus, the ZnO film in the sixth example is also usable as a buffer layer or the like in manufacturing of LED elements using a group III nitride semiconductor thin film.

In addition, when a Mg-added ZnO film (hereinafter called a MgZnO film) is formed by the film forming method according to the present invention using a target made of a Mg—Zn alloy instead of the target of the metal Zn, the MgZnO film having excellent crystalline with +c polarity can be obtained as in the case of the ZnO film. As for the MgZnO film, band-gap energy can be controlled depending on an amount of Mg added. Thus, if the MgZnO film is used as a light emission layer, it is possible to produce an LED element having an emission wavelength different from that of the element formed by only using the ZnO film.

Sixth Comparative Example

In a sixth comparative example, a ZnO film is formed on an α-Al$_2$O$_3$ (0001) substrate with the same method and conditions as those in the sixth embodiment except that the high-frequency bias power is not applied to the bias electrode, although the application is the distinctive feature of the present invention. The ZnO film in the sixth comparative example is obtained as an epitaxial film with c-axis orientation as in the sixth example, but the polarity thereof is mixture of +c polarity (Zn polarity) and −c polarity (O polarity).

Moreover, even if an LED element is fabricated by using the obtained ZnO film as in the sixth example, it is difficult to obtain favorable element characteristics.

Moreover, when an undoped GaN film having a film thickness of 2 μm is formed on the ZnO film in the sixth comparative example by using the MOCVD method, the surface of the obtained undoped GaN film is cloudy, and the GaN film having excellent crystalline is difficult to obtain. Then, when a MgZnO film is formed by using a target made of a Mg—Zn alloy instead of the target of the metal Zn, the obtained MgZnO film has mixture of +c polarity and −c polarity, and thus the MgZnO film with excellent crystalline is difficult to obtain.

As described above, the film forming method according to the present invention produces beneficial effects even when a thin film material to be formed is a ZnO-based semiconductor thin film such as a ZnO film or MgZnO film, and is extremely effective means for obtaining a ZnO-based semiconductor thin film having excellent crystalline with +c polarity.

Here, if the experiment similar to the sixth example is conducted by using a Si (111) substrate, a ZnO-based semiconductor thin film with +c polarity can be obtained also on the Si (111) substrate. In contrast, if the experiment similar to the sixth comparative example is conducted by using a Si (111) substrate, the polarity of the obtained ZnO-based semiconductor thin film is mixture of +c polarity and −c polarity.

Note that the substrates usable in the film forming method according to the present invention are not limited to the $\alpha$-$Al_2O_3$ (0001) substrate and the Si (111) substrate.

For example, the $\alpha$-$Al_2O_3$ (0001) substrate and the Si (111) substrate have an epitaxial relationship with a group III nitride semiconductor thin film or a ZnO-based semiconductor thin film, but do not have, on its substrate surface, crystal information capable of controlling the polarity of the group III nitride semiconductor thin film, the ZnO-based semiconductor thin film, or the like. In this specification, such a substrate is referred to as a substrate with a non-polar surface.

For this reason, without using a film forming method capable of controlling the polarity of a group III nitride semiconductor thin film or a ZnO-based semiconductor thin film like the film forming method according to the present invention, it is difficult to form a group III nitride semiconductor thin film or a ZnO-based semiconductor thin film with +c polarity on a substrate with a non-polar surface. However, use of the film forming method according to the present invention enables a group III nitride semiconductor thin film or a ZnO-based semiconductor thin film with +c polarity to be formed even on a substrate with a non-polar surface.

As such a substrate with a non-polar surface, there are a germanium (Ge) (111) substrate, a Si (111) substrate having a surface on which a (111)-oriented SiGe epitaxial film is formed, a Si (111) substrate in which a (111)-oriented carbon (C)-doped Si (111) epitaxial film is formed, and the like.

In order to obtain a group III nitride semiconductor thin film or ZnO-based semiconductor thin film with +c polarity, generally and often used rare a 4H—SiC (0001) substrate or a 6H—SiC (0001) substrate having a substrate surface called a Si surface, a GaN (0001) substrate having a substrate surface called a Ga surface, and the like. The aforementioned substrates having the Si surface and the Ga surface each have an epitaxial relationship with a group III nitride semiconductor thin film and a ZnO-based semiconductor thin film, and also have a substrate surface with crystallization information capable of controlling the group III nitride semiconductor thin film and the ZnO-based semiconductor thin film to +c polarity. For this reason, these substrates are characterized in that a group III nitride semiconductor thin film and ZnO-based semiconductor thin film with +c polarity can be easily obtained without using a special film forming technique capable of controlling the polarity of the group III nitride semiconductor thin film and the ZnO-based semiconductor thin film. In this specification, such a substrate having an epitaxial relationship with a group III nitride semiconductor thin film and a ZnO-based semiconductor thin film, and also having crystallization information capable of controlling the group III nitride semiconductor thin film and the ZnO-based semiconductor thin film to +c polarity is referred to as a substrate with a polar surface.

On such a substrate with a polar surface, a group III nitride semiconductor thin film or a ZnO-based semiconductor thin film with relatively high quality in which the +c polarity is present at a high proportion can be obtained even without using the film forming method according to the present invention. However, even in the case of using such a substrate, use of the film forming method according to the present invention makes it possible to obtain a group III nitride semiconductor thin film or a ZnO-based semiconductor thin film with high quality in which the unification of +c polarity is more improved.

By use of the above substrate with the polar surface, a group III nitride semiconductor thin film, a ZnO-based semiconductor thin film or the like tends to be obtained as an epitaxial film which is nearly completely +c polar. In some cases, however, few regions with −c polarity (hereinafter referred to as an inverted domain region) are partially formed at the initial stage of growth, in particular, or other stages. The inverted domain may form a defect such as a polarity inversion boundary, which may be propagated to the surface of the above thin film. In other words, use of the film forming method according to the present invention further reduces the possibility of forming such an inverted domain, and further suppresses formation of a defect such as a polarity inversion boundary. Thus, it is concluded that the effect of the present invention can be obtained even in the case of using a substrate with a polar surface.

Such substrates having an epitaxial relationship with a group III nitride semiconductor thin film and a ZnO-based semiconductor thin film, and having a non-polar surface or a polar surface are collectively referred to by using a term of a substrate for epitaxial growth.

The major feature of the present invention is to focus on an idea of applying high-frequency bias power to a bias electrode in forming a group III nitride semiconductor thin film or a ZnO-based semiconductor thin film with a wurtzite crystal structure on a substrate for epitaxial growth by a sputtering method using a target with a wurtzite structure or a target for forming a film with a wurtzite structure by deposition. It is an unprecedented technical idea to generate the electric field of the sheath region S on the film formation surface side of the substrate by means of application of the high-frequency bias power to the bias electrode, to make the generated electric field to act on polarization of the nitride molecules ejected from the target so as to control their orientation, and to use the orientation to obtain a group III nitride semiconductor thin film or a ZnO-based semiconductor thin film with +c polarity and a wurtzite crystal structure. Note that the target with the wurtzite structure is a target having a wurtzite structure such as AlN, GaN, or ZnO, whereas the target for forming a film with a wurtzite structure by deposition is a metal target such as Al, Ga, or Zn, which forms a film with a wurtzite structure on a substrate by being sputtered in the presence of a reactive gas of an $O_2$ gas, a $N_2$ gas, and the like.

Moreover, it is also an unprecedented technical idea to obtain a group III nitride semiconductor thin film or a ZnO-based semiconductor thin film having +c polarity and a wurtzite crystal structure with good reproducibility by preventing or reducing low-frequency beat caused by interference between the high-frequency power applied to the target electrode and the high-frequency power applied to the bias electrode, that is, frequency interference.

Figure 8:
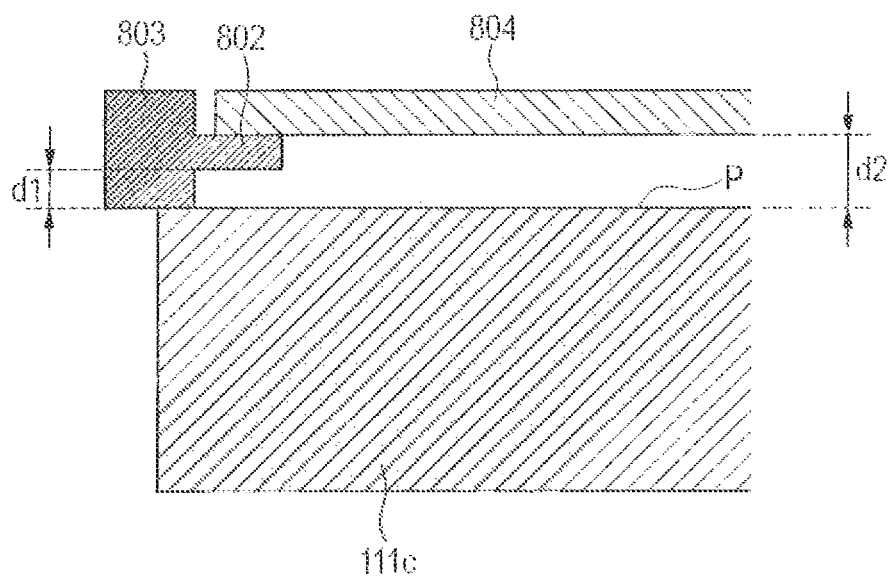
FIG. 8 is a diagram illustrating a fourth configuration example of a substrate holder according to one embodiment of the present invention.

In addition, the present inventors have found that application of the foregoing technical ideas to the case of using a substrate spaced-placement holder 111d illustrated in FIG. 8 is also effective to obtain a high-quality epitaxial film with +c polarity. FIG. 8 illustrates a schematic view of a partial cross section of the substrate spaced-placement holder 111d. The substrate spaced-placement holder 111d is capable of placing a substrate 804 away from a substrate placement surface M of a substrate holder (for example, 111c) at a predetermined distance. In FIG. 8, reference numeral 802 denotes a substrate support portion made of an insulator, reference numeral 803 denotes a placement portion formed integrally with the substrate support portion 802, reference numeral P denotes a substrate facing surface of the substrate holder 111c, reference numeral d1 denotes a clearance between the substrate support portion 802 and the substrate facing surface P, and reference numeral d2 denotes a clearance between the substrate 804 and the substrate facing surface P. Incidentally, the substrate facing surface P in the substrate spaced-placement holder 111d is the same surface as the substrate placement surface M in the substrate holder 111c in FIG. 4, but this surface is referred to as the substrate facing surface P because the substrate 804 placed in the substrate spaced-placement holder 111d is not in direct contact with the substrate holder 111c.

As illustrated in FIG. 8, the substrate 804 is held at its outer periphery part by the substrate support portion 802, and is held with a space interposed between the substrate 804 and the substrate facing surface P and a space interposed between the substrate support portion 802 and the substrate facing surface P. The distance of the clearance d1 is preferably 0.4 mm or more, and the clearance d2 is preferably 0.5 mm or more. In addition, the clearance d1 and the clearance d2 are preferably 5 mm or less, and are more preferably 2 mm or less. This is because, if the clearance d2, in particular, is set too wide, plasma is generated in the space between the substrate 804 and the substrate facing surface P. A high-quality epitaxial film with +c polarity can be obtained by providing the clearance d1 and the clearance d2 having appropriate distances as described above, and by using the film forming method according to the present invention in which high frequency interference is suppressed.

Example 7

As a seventh example, an example will be described below in which an AlN film is formed on an $\alpha$-$Al_2O_3$ (0001) substrate by using the substrate spaced-placement holder 111d illustrated in FIG. 8, and thereafter an undoped GaN film is formed by the MOCVD method. More specifically, the example will be described in which the AlN film is formed on the $\alpha$-$Al_2O_3$ (0001) substrate by a sputtering method with high-frequency bias power applied to a common electrode, not shown, in the substrate spaced-placement holder 111d, and thereafter the substrate is introduced into the MOCVD device to form the undoped GaN film having a film thickness of 5 μm. Note that, in the seventh example, the AlN film is formed by using the same apparatus and conditions as those in the first example except of use of the substrate spaced-placement holder 111d illustrated in FIG. 8, and the undoped GaN film is grown by using the same film forming method and film forming conditions as those in the second example.

The AlN film obtained in the seventh example is confirmed to be formed as a film with +c polarity by the CAICISS measurement, and is also confirmed to be formed as a c-axis orientation epitaxial film with small mosaic expansion of tilt and twist by the symmetric plane and in-plane XRC measurements. In addition, when the undoped GaN film is grown on the above AlN film, the epitaxial film having extremely excellent crystalline is obtained. The undoped GaN film obtained in the seventh example has better crystal quality than an undoped GaN film grown by the MOCVD method after an AlN film is formed on an $\alpha$-$Al_2O_3$ (0001) substrate by using the sputtering method without applying high-frequency bias power to the common electrode, not shown.

Here, in the case where the outer periphery part of a substrate is held as illustrated in FIG. 8, it is preferable to use an insulator for a material for the substrate support portion and the placement portion. When a conductive material is used, a polarity distribution tends to vary between the outer periphery part of the substrate and a center part of the substrate. For example, there may arise a problem such that the +c polarity is obtained at the center part of the substrate, while the outer periphery part of the substrate has mixed polarity. Moreover, in the case where the target is arranged on a lower side of the apparatus while the substrate holder is arranged on an upper side of the apparatus, frequently used is a method, for example, in which the outer periphery part of the substrate is directly held by the substrate support portion, or in which the substrate is placed on a tray having as opening portion and is held by the outer periphery part of the opening portion, and a film is formed on the surface of the substrate from the opening portion of the tray. In this case, it is also preferable that the substrate support portion for holding the substrate be made of an insulator.

Further, in order to form a group III nitride semiconductor thin film or a ZnO-based semiconductor thin film with +c polarity on a substrate with a non-polar surface by the sputtering method, the film forming method according to the present invention has to be applied to film formation of at least a first layer formed on the substrate. This is because, if the film forming method according to the present invention is not applied to the film formation of the first layer, the first layer is likely to have mixed polarity or have −c polarity. If the −c polarity is mixed in the first layer, it is difficult to obtain a group III nitride semiconductor thin film or a ZnO-based semiconductor thin film with +c polarity in the following film formation. Note that, the first layer is a film layer directly formed on the substrate and corresponds to the buffer layer 602 in FIG. 6.

The invention claimed is:

1. An epitaxial film forming method of forming an epitaxial film on a substrate by using a sputtering method comprising:
placing the substrate in a vessel in which at least one of a target with a wurtzite structure and a target for forming a film with a wurtzite structure by deposition;
applying high-frequency power to a target electrode to which the target is attached, and applying high-frequency bias power to a substrate holder supporting the substrate in such a manner as to suppress frequency interference between the applied high-frequency power and the applied high-frequency bias power; and
forming the epitaxial film on the substrate by sputtering the target with plasma generated by the high-frequency power, wherein the forming the epitaxial film includes causing the target to give off a molecule of the target by applying the high-frequency power to the target electrode while generating an electric field that orients a polarization from a negative charge to a positive charge of the molecule toward the substrate supported by the substrate holder by applying the high-frequency bias power to the substrate holder.

2. The epitaxial film forming method according to claim 1, wherein the film is formed while the substrate is heated to a predetermined temperature by the substrate holder.

3. The epitaxial film forming method according to claim 1, wherein the high-frequency power and the high-frequency bias power are applied with the frequency interference suppressed by setting the high-frequency power and the high-frequency bias power to have different frequencies.

4. The epitaxial film forming method according to claim 1, wherein the high-frequency power and the high-frequency bias power are applied with the frequency interference suppressed by setting the high-frequency power and the high-frequency bias power to have an equal frequency and by setting a phase difference between the high-frequency power and the high-frequency bias power to be approximately 180°.

5. The epitaxial film forming method according to claim 1, wherein the substrate holder includes a bias electrode having a first electrode to which a DC voltage with first polarity is to be applied, and a second electrode to which a DC voltage with second polarity different from the first polarity is to be applied, and
the epitaxial film is formed on the substrate in a state where the substrate holder electrostatically adsorbs the substrate by application of the DC voltages to the first electrode and the second electrode, and where the high-frequency bias power is applied to the first electrode and the second electrode.

6. The epitaxial film forming method according to claim 1, wherein the high-frequency bias power is applied after the high-frequency power is applied and before a film formation surface of the substrate is covered with a crystal layer made of a semiconductor with a wurtzite structure.

7. The epitaxial film forming method according to claim 1, further comprising the step of:
forming a buffer layer of a semiconductor light-emitting element on the substrate.

8. The epitaxial film forming method according to claim 1, wherein a film with the wurtzite structure is formed on the substrate in a state where the substrate is held away from a substrate facing surface of the substrate holder at a predetermined distance.

9. A semiconductor light-emitting element in which at least a buffer layer, a group III nitride semiconductor intermediate layer, an n-type group III nitride semiconductor layer, a group III nitride semiconductor active layer, a p-type group III nitride semiconductor layer, and a translucent electrode are laminated in this order on the substrate, wherein at least one layer of the buffer layer, the group III nitride semiconductor intermediate layer, the n-type group III nitride semiconductor layer, the group III nitride semiconductor active layer, and the p-type group III nitride semiconductor layer is fabricated by an epitaxial film forming method of forming an epitaxial film on the substrate by using a sputtering method comprising:
placing the substrate in a vessel in which at least one of a target with a wurtzite structure and a target for forming a film with a wurtzite structure by deposition;
applying high-frequency power to a target electrode to which the target is attached, and applying high-frequency bias power to a substrate holder supporting the substrate in such a manner as to suppress frequency interference between the applied high-frequency power and the applied high-frequency bias power; and
forming the epitaxial film on the substrate by sputtering the target with plasma generated by the high-frequency power,
wherein the forming the epitaxial film includes causing the target to give off a molecule of the target by applying the high-frequency power to the target electrode while generating an electric field that orients a polarization from a negative charge to a positive charge of the molecule toward the substrate supported by the substrate holder by applying the high-frequency bias power to the substrate holder.

10. An illumination device comprising a semiconductor light-emitting element in which at least a buffer layer, a group III nitride semiconductor intermediate layer, an n-type group III nitride semiconductor layer, a group III nitride semiconductor active layer, a p-type group III nitride semiconductor layer, and a translucent electrode are laminated in this order on a substrate, wherein at least one layer of the buffer layer, the group III nitride semiconductor intermediate layer, the n-type group III nitride semiconductor layer, the group III nitride semiconductor active layer, and the p-type group III nitride semiconductor layer is fabricated by an epitaxial film forming method of forming an epitaxial film on the substrate by using a sputtering method comprising:
placing the substrate in a vessel in which at least one of a target with a wurtzite structure and a target for forming a film with a wurtzite structure by deposition;
applying high-frequency power to a target electrode to which the target is attached, and applying high-frequency bias power to a substrate holder supporting the substrate in such a manner as to suppress frequency interference between the applied high-frequency power and the applied high-frequency bias power; and
forming the epitaxial film on the substrate by sputtering the target with plasma generated by the high-frequency power,
wherein the forming the epitaxial film includes causing the target to give off a molecule of the target by applying the high-frequency power to the target electrode while generating an electric field that orients a polarization from a negative charge to a positive charge of the molecule toward the substrate supported by the substrate holder by applying the high-frequency bias power to the substrate holder.

11. A sputtering apparatus for executing an epitaxial film forming method of forming an epitaxial film on a substrate by using a sputtering method comprising:
a power supply;
a target electrode on which at least one of a target with a wurtzite structure and a target for forming a film with a wurtzite structure by deposition is able to be placed;
a substrate holder on which the substrate is able to be placed to face the target electrode, and which includes a heater electrode and a bias electrode; and
frequency interference suppressing means for suppressing frequency interference between high-frequency power applied to the target electrode and high-frequency bias power applied to the bias electrode when forming the film with the wurtzite structure on the substrate by sputtering the target with plasma generated by the high-frequency power,
wherein, in forming the epitaxial film, application of the high-frequency power to the target electrode causes the target to give off a molecule of the target while application of the high-frequency bias power to the bias electrode generates an electric field that orients a polarization from a negative charge to a positive charge of the molecule toward the substrate supported by the substrate holder.

12. The sputtering apparatus according to claim 11, wherein the frequency interference suppressing means is configured to set the high-frequency power and the high-frequency bias power to have different frequencies.

13. The sputtering apparatus according to claim 11, wherein the frequency interference suppressing means is configured to set the high-frequency power and the high-frequency bias power to have an equal frequency and to set a phase difference between the high-frequency power and the high-frequency bias power to be approximately 180°.

14. The sputtering apparatus according to claim 11, wherein the bias electrode has a first electrode to which a DC voltage with first polarity is to be applied, and a second electrode to which a DC voltage with second polarity different from the first polarity is to be applied, and the power supply is configured to, in forming the film with the wurtzite structure, apply the DC voltages to the first electrode and the second electrode to cause the substrate holder to electrostatically adsorb the substrate, and apply the high-frequency bias power to the first electrode and the second electrode.

15. The sputtering apparatus according to claim 11, wherein the power supply is configured to, in forming the film with the wurtzite structure, apply the high frequency bias power to the bias electrode after the high-frequency power is applied and before a film formation surface of the substrate is covered with a crystal layer made of a semiconductor with a wurtzite structure.

16. The sputtering apparatus for executing the epitaxial film forming method of forming an epitaxial film on a substrate by using a sputtering method comprising:

a power supply;

a target electrode on which at least one of a target with a wurtzite structure and a target for forming a film with a wurtzite structure by deposition is able to be placed;

a substrate holder on which the substrate is able to be placed to face the target electrode, and which includes a heater electrode and a bias electrode; and frequency interference suppressing means for suppressing frequency interference between high-frequency power applied to the target electrode and high-frequency bias power applied to the bias electrode when forming the film with the wurtzite structure on the substrate by sputtering the target with plasma generated by the high-frequency power, wherein the substrate holder is arranged on a lower side of the target electrode with respect to the gravity in a vacuum vessel, and the substrate is held away from a substrate facing surface of the substrate holder at a predetermined distance when a film with the wurtzite structure is grown on the substrate heated to a predetermined temperature by the heater electrode.

* * * * *